United States Patent [19]
Williams et al.

[11] Patent Number: 5,991,523
[45] Date of Patent: Nov. 23, 1999

[54] METHOD AND SYSTEM FOR HDL GLOBAL SIGNAL SIMULATION AND VERIFICATION

[75] Inventors: Anthony D. Williams, San Bruno; Jeffrey H. Seltzer; Carol A. Fields, both of Los Gatos; Roberta E. Fulton, San Jose; Dhimant Patel, San Jose; Veena N. Kumar, San Jose, all of Calif.

[73] Assignee: Xilinx, Inc., San Jose, Calif.

[21] Appl. No.: 08/820,741

[22] Filed: Mar. 18, 1997

[51] Int. Cl.$^6$ .................................................. G06F 17/50
[52] U.S. Cl. ............................ 395/500.19; 395/500.18; 395/500.17; 395/500.05; 395/500.36
[58] Field of Search ..................... 364/488–491, 364/578; 395/500.02, 500.19, 500.35, 500.36, 500.37

[56] References Cited

U.S. PATENT DOCUMENTS

| | | | |
|---|---|---|---|
| 5,111,413 | 5/1992 | Lazansky et al. | 364/578 |
| 5,337,255 | 8/1994 | Seidel et al. | 364/489 |
| 5,422,833 | 6/1995 | Kelem et al. | 364/578 |
| 5,425,036 | 6/1995 | Liu et al. | 371/23 |
| 5,452,226 | 9/1995 | Hooper et al. | 364/489 |
| 5,499,192 | 3/1996 | Knapp et al. | 364/489 |
| 5,526,278 | 6/1996 | Powell | 364/489 |
| 5,553,001 | 9/1996 | Seidel et al. | 364/488 |
| 5,691,912 | 11/1997 | Duncan | 364/490 |
| 5,875,115 | 2/1999 | Weber | 364/490 |

OTHER PUBLICATIONS

Perry ("HDL design drived FPGA performance", Electronic Engineering Times, No. 904, p. T20, May 31, 1996).

*Primary Examiner*—Kevin J. Teska
*Assistant Examiner*—Phallaka Kik
*Attorney, Agent, or Firm*—Adam H. Tachner; Philip M. Shaw, Jr.; Edel M. Young

[57] ABSTRACT

The notion of global signals (e.g., global set/reset and global tristate) is of significance to programmable logic user throughout the design process. Regardless of whether the HDL designer explicitly describes the use of a global signal, they are present in the implemented device since they are an integral part of the initialization and start-up process. This may lead to mismatches between the Register Transfer Level (RTL) simulation and the timing simulation. While a methodology for verifying the functionality of global signals is available for schematic design entry, none exists for HDL design tools. A verification method for HDL designers is disclosed providing access to all the functionality relating to global networks currently available to the schematic designers and allowing reuse of the testbench without losing HDL code portability.

20 Claims, 25 Drawing Sheets

```
LIBRARY ieee;
USE ieee.std_logic_1164.ALL;
USE ieee.vital_timing.ALL;

ENTITY roc IS
     GENERIC ( InstancePath: string := "*";
                 width : TIME := 0 NS) ;
      PORT (o : OUT std_ulogic := '1' );
      ATTRIBUTE vital_level0 OF roc : ENTITY IS TRUE;
END roc;

ARCHITECTURE roc_v OF roc IS
ATTRIBUTE vital_level0 OF roc_v : ARCHITECTURE IS TRUE;
BEGIN
     one_shot: PROCESS
      BEGIN
           WAIT FOR width;
           o <= '0';
           WAIT;
      END PROCESS one_shot;
END roc_v;

CONFIGURATION cfg_roc_v OF roc IS
     FOR roc_v
     END FOR;
END cfg_roc_v;
```

FIG. 9

```
LIBRARY ieee;
USE ieee.std_logic_1164.ALL;
USE ieee.std_logic_unsigned.ALL;

LIBRARY xilinx;
USE xilinx.ALL;

ENTITY counter IS
    PORT( count : OUT std_logic_vector(3 DOWNTO 0);
          clear : IN std_logic;
          clock : IN std_logic );   - - Note that there's no reset PORT - -
END counter;                         - - on the design's entity.            - -

ARCHITECTURE case1 OF counter IS

SIGNAL local_count : std_logic_vector(3 DOWNTO 0);
    SIGNAL ROC_net : std_logic;

COMPONENT ROC
    GENERIC (width : TIME);
      PORT ( o : OUT std_ulogic );
    END COMPONENT;

BEGIN u1 : ROC
        GENERIC MAP  (width => 1000 ns)
        PORT MAP ( o => ROC_net );

count <= local_count;

p1 : PROCESS( clock, ROC_net )
      BEGIN
        IF (ROC_net='1' or clear='1') THEN
          local_count <= "0000";
        ELSEIF clock'EVENT AND clock='1' THEN
          local_count <= local_count + 1;
        END IF;
      END PROCESS;

END case1;

CONFIGURATION cfg_case1 OF counter IS
    FOR case1
    END FOR;
END cfg_case1;
```

FIG. 10

```
LIBRARY ieee;
USE ieee.std_logic_1164.ALL;
USE ieee.vital_timing.ALL;

ENTITY rocbuf IS
GENERIC ( InstancePath: string := "*";
          width : TIME := 0 NS) ;
  PORT ( i : IN std_ulogic;
         o : OUT std_ulogic );
ATTRIBUTE vital_level0 OF rocbuf : ENTITY IS TRUE;
END rocbuf;

ARCHITECTURE rocbuc_v OF rocbuf IS
ATTRIBUTE vital_level0 OF rocbuc_v : ARCHITECTURE IS TRUE;

SIGNAL roc_local : std_ulogic := '1';

BEGIN
o <= i OR roc_local;
    one_shot: PROCESS
    BEGIN
        WAIT FOR width;
        roc_local <= '0';
        WAIT;
    END PROCESS one_shot;
END rocbuf_v;

CONFIGURATION cfg_rocbuf_v OF rocbuf IS
     FOR rocbuf_v
     END FOR;
END cfg_rocbuf_v;
```

FIG. 14

```
LIBRARY ieee;
USE ieee.std_logic_1164.ALL;
USE ieee.std_logic_unsigned.ALL;

LIBRARY xilinx;
USE xilinx.ALL;

ENTITY counter IS
    PORT( count : OUT std_logic_vector(3 DOWNTO 0);
          clear : IN std_logic;
          clock : IN std_logic;
          user_simulation_port : IN std_logic);
-- Note that the user_simulation_port port appears in
-- the HDL code *only* and will not
-- appear on the target device END counter;

ARCHITECTURE case2 OF counter IS

SIGNAL local_count : std_logic_vector(3 DOWNTO 0);
    SIGNAL rocbuf_net : std_logic;

COMPONENT rocbuf
        GENERIC (width : TIME);
        PORT ( i : IN std_ulogic;
               o : OUT std_ulogic );
    END COMPONENT;

BEGIN u1 : rocbuf
        GENERIC MAP  (width => 1000 ns)
        PORT MAP ( i => user_simulation_port, o => rocbuf_net);

count <= local_count;

p1 : PROCESS( clock, rocbuf_net )
    BEGIN
        IF (rocbuf_net='1' or clear='1') THEN
            local_count <= "0000";
        ELSEIF clock'EVENT AND clock='1' THEN
            local_count <= local_count + 1;
        END IF;
    END PROCESS;

END case2:

CONFIGURATION cfg_case2 OF counter IS
    FOR case2
    END FOR;
END cfg_case2;
```

FIG. 15

```
LIBRARY ieee;
USE ieee.std_logic_1164.ALL;
USE ieee.vital_timing.ALL;

ENTITY startbuf IS
GENERIC( InstancePath: string := "*";
             width : TIME := 0 NS) ;
   PORT ( i : IN std_ulogic;
          o : OUT std_ulogic );
ATTRIBUTE vital_level0 OF startbuf : ENTITY IS TRUE;
END startbuf;

ARCHITECTURE startbuf_v OF startbuf IS
ATTRIBUTE vital_level0 OF startbuf_v : ARCHITECTURE IS TRUE;

SIGNAL roc_local : std_ulogic := '1';

BEGIN
o <= i OR roc_local;
    one_shot: PROCESS
      BEGIN
         WAIT FOR width;
         roc_local <= '0';
         WAIT;
    END PROCESS one_shot;
END startbuf_v;

CONFIGURATION cfg_startbuf_v OF startbuf IS
      FOR startbuf_v
      END FOR;
END cfg_startbuf_v;
```

FIG. 19

```vhdl
LIBRARY ieee;
USE ieee.std_logic_1164.ALL;
USE ieee.std_logic_unsigned.ALL;

LIBRARY xilinx;
USE xilinx.ALL;

ENTITY counter IS
    PORT( count : OUT std_logic_vector(3 DOWNTO 0);
          clear : IN std_logic;
          clock : IN std_logic;
          reset : IN std_logic);
END counter;

ARCHITECTURE case3 OF counter IS

SIGNAL local_count : std_logic_vector(3 DOWNTO 0);
    SIGNAL reset_net   : std_logic;

COMPONENT startbuf
        GENERIC (width : TIME);
        PORT ( i : IN std_ulogic;
               o : OUT std_ulogic );
    END COMPONENT;

BEGIN u1 : startbuf
        GENERIC MAP  (width => 1000 ns)
        PORT MAP ( i => reset, o => reset_net );

count <= local_count;

p1 : PROCESS( clock, reset_net, clear )
    BEGIN
        IF reset_net='1' OR clear='1' THEN
            local_count <= "0000";
        ELSEIF clock'EVENT AND clock='1' THEN
            local_count <= local_count + 1;
        END IF;
    END PROCESS;

END case3;

CONFIGURATION cfg_case3 OF counter IS
    FOR case3
    END FOR;
END cfg_case3;
```

FIG. 20

```
LIBRARY ieee;
USE ieee.std_logic_1164.ALL;
USE ieee.vital_timing.ALL;

ENTITY startbuf IS
GENERIC( InstancePath: string := "*";
         width : TIME := 0 NS) ;
   PORT ( i : IN std_ulogic;
          o : OUT std_ulogic );
ATTRIBUTE vital_level0 OF startbuf : ENTITY IS TRUE;
END startbuf;

ARCHITECTURE startbuf_v OF startbuf IS
ATTRIBUTE vital_level0 OF startbuf_v : ARCHITECTURE IS TRUE;

SIGNAL roc_local : std_ulogic := '1';

BEGIN
o <= i OR roc_local;
      one_shot: PROCESS
         BEGIN
            WAIT FOR width;
             roc_local <= '0';
            WAIT;
         END PROCESS one_shot;
END startbuf_v;

CONFIGURATION cfg_startbuf_v OF startbuf IS
      FOR startbuf_v
      END FOR;
END cfg_startbuf_v;
```

FIG. 24

```
LIBRARY ieee;
USE ieee.std_logic_1164.ALL;
USE ieee.std_logic_unsigned.ALL;

LIBRARY xilinx;
USE xilinx.ALL;

ENTITY counter IS
    PORT( count : OUT std_logic_vector(3 DOWNTO 0);
          clear : IN std_logic;
          clock : IN std_logic ;
          reseta : IN std_logic;
          resetb : IN std_logic);
END counter;

ARCHITECTURE case4 OF counter IS

SIGNAL local_count : std_logic_vector(3 DOWNTO 0);
    SIGNAL reset_condition : std_logic;
    SIGNAL reset_net     : std_logic;

COMPONENT startbuf
        GENERIC (width : TIME);
        PORT ( i : IN std_ulogic;
               o : OUT std_ulogic );
    END COMPONENT;

BEGIN u1 : startbuf
        GENERIC MAP  (width => 1000 ns)
        PORT MAP ( i => reset_condition, o => reset_net );

reset_condition <= reseta AND resetb;

count <= local_count;

p1 : PROCESS( clock, clear, reset_net )
    BEGIN
        IF reset_net='1' or clear='1' THEN
            local_count <= "0000";
        ELSEIF clock'EVENT AND clock='1' THEN
            local_count <= local_count + 1;
        END IF;
    END PROCESS;

END case4;

CONFIGURATION cfg_case4 OF counter IS
    FOR case4
    END FOR;
END cfg_case4;
```

FIG. 25

METHOD AND SYSTEM FOR HDL GLOBAL SIGNAL SIMULATION AND VERIFICATION

FIELD OF THE INVENTION

The present invention is related generally to the field of Hardware Description Languages (HDL), and more specifically to the accurate functional simulation of HDL logic designs intended for programmable logic devices.

BACKGROUND OF THE INVENTION

Hardware Description Language (HDL) is a text-based approach to digital logic design through behavioral or structural description of design elements intended for combination and implementation on (1) a field programmable device as in an FPGA or CPLD, (2) a mask programmable device as in a hardwired PGA or ASIC, (3) a system formed from selected electronic hardware components, or (4) any other electronic devices. The HDL-based design methodology requires the user to describe the behavior of a system which may then be simulated (a process referred to as Register Transfer Level (RTL) simulation) to determine whether it will function as desired. The design is then synthesized to create a logical netlist that can be implemented within a particular Programmable Logic Device (PLD) or a particular PLD vendor's device group.

Assuming that neither the synthesis or the design implementation processes alter the behavior of the design, RTL simulation provides the designer with insight into the functionality and behavior of the implemented device before the costly and time consuming synthesis and design implementation processes take place. If accurate, RTL simulation represents a quick and efficient means of validating a design's (and ultimately, a programmed device's) behavior.

However, any assumption that neither the synthesis process or the design implementation process will alter the behavior of a design is, with available HDL tools and simulation methodologies, incorrect. Many device specific features cannot be accurately simulated at the RTL level with available tools. For example, devices such as Field Programmable Gate Arrays (FPGAs) and Complex Programmable Logic Devices (CPLDs) available from Xilinx, Inc., the assignee of the present invention, introduce into the implemented design global signals that a) unconditionally set or reset all of the design's sequential elements (the "global reset" (GR) or "global set/reset" (GSR) network), and b) tristate all of the device's—and therefore all of the design's—output drivers (the "global tristate" (GTS) network). These signals are used by the device's internal configuration controller during initialization and effectively determine a) the device's power-on state, and b) the device's initial interactions with its host system. The GSR 2 and GTS 4 networks on a programmable device 6 are illustrated in FIG. 1.

At the instant power is applied to a PLD, the device will undergo a "wake-up" initialization process that may be as simple as a mere power stabilization time-out, or as complex as reconfiguration over a microprocessor bus. In all cases, a period of time will pass while the device is not performing the function intended by the designer, but is instead executing any required initialization processes before it can assume the user's function. Once these processes are completed, the device switches over to the user's programmed function and user operation begins, as illustrated in the timing diagram of FIG. 2.

The transition from the initialization phase to the user operation phase is known as "start-up" 7 in FIG. 2, and different device families offer a variety of means for controlling the start-up process. For example, while a device is initializing it will typically tristate (electrically isolate) all pins that are not used during the initialization process. This prevents any interaction with the surrounding circuitry before the device assumes its programmed function. The precise moment during start-up when the device activates its input/output (I/O) circuitry and starts to interact with its surrounding circuitry may be critical, and so the ability to control this event is one of several start-up options that are available to the user.

"Start-up" blocks for the global networks on devices produced by Xilinx, Inc., the assignee of the present invention, are illustrated in FIG. 3. An example of usage of STARTUP EX. 1 from FIG. 3 is illustrated in FIG. 4. The start-up block provides the user access to the various functions that are available during the start-up phase of the device's operation, including the global reset and the global tristate signals. The start-up block is a small cell—usually fairly well hidden in one corner of the chip, as shown in FIG. 3—whose pins are accessible via special extensions to the device's general purpose interconnect. Attaching a signal to the GSR/GR or GTS pins of the start-up block introduces that signal to the appropriate global network on the device, as illustrated in FIG. 4.

Globally tristating the I/Os of a device for initialization purposes is achieved by the device's initialization controller asserting a signal known as "global tristate" —an internal signal connected to the output drivers in every I/O cell. Globally tristating overrides any other signal that might be driving an output and causes the output driver to go tristate.

In a similar fashion, a signal known as "global reset" (or "global set/reset" in some architectures) is asserted by the initialization controller during initialization and released during the start-up phase. The function of the global reset signal is to asynchronously hold the registers and latches within the device in the initial states desired by the designer. In the same way that global tristate can be released at the specific instant chosen by the designer, the global reset signal can be released at any time during start-up. Without such a global reset signal, the initial contents of the registers and latches in a programmable device could not be controlled, and designers would be limited to building designs that are insensitive to initial conditions.

In addition to providing a programmable device with a means of initializing itself without inadvertently interacting with the surrounding circuitry and of placing its registers and latches in the initial states required by the designer, the global networks for forwarding these signals remain available once the device has assumed its post-initialization function. For example, if the designer requires the ability to reset a system back to its initial state, the designer can access the global reset signal so that it may be asserted during user operation. In most FPGA and CPLD architectures, the device's internal global reset and global tristate signals are made available to the user so that they may be asserted by signals that come from off-chip, or signals that are generated by user logic within the chip. For example, a reset switch somewhere on a piece of equipment might be used to reset the system back to a known initial state. Different device architectures impose slightly different restrictions on how these two global signals can be used, but essentially, the same functions that are used by the device's internal initialization controller can be accessed by the designer.

Some global signal networks are especially useful in that the reset state of each register or latch is programmable. That is, the user may choose the state that each individual register will assume on assertion of the device's global reset signal. However, as a result of the way in which this selection mechanism is implemented on the silicon in some devices, the user's choice of a register's initial state may dictate the role of that register's asynchronous control pin. For example, if a register is assigned an initial state of High, then the register's asynchronous control input becomes an asynchronous set, and if a register is assigned an initial state of Low, then the register's asynchronous control input becomes an asynchronous clear. Conversely, if a designer requires a register with an asynchronous set input then the register will have an initial state of High, and if a designer requires a register with an asynchronous clear input then the register will have an initial state of Low, as illustrated in FIG. 5.

Thus, in simulating global networks, one must consider the myriad effects accommodating global signals will have on synthesis accuracy. Since global networks which are pre-routed are not made available to most synthesis tools, these tools will not synthesize the correct logical netlist that results in the use of the target device's global networks. Instead, most synthesis tools will interpret the RTL description literally and introduce additional logic into the design with which to implement the desired reset network. Without specific instructions to use the device's global networks, the design implementation tools will be forced to consume general purpose logic and interconnect resources to build functions that the silicon already provides, resulting in inefficient implementation and decreased device utility.

It is therefore paramount that an HDL-based specification of a user methodology relating to the use of global signals not result in designs that are implemented inefficiently (by replicating functionality already present on the target device.) Further, since the capabilities of different synthesis tools vary in terms of their ability to synthesize designs that make use of global resources, a thorough solution should also be insensitive to an individual tool's strengths and weaknesses in this area. Finally, a thorough solution should not compromise the HDL code's portability between different synthesis tools, and different PLD and/or ASIC vendors' products.

These challenges have been dealt with for schematic-based design tools, but remain unaddressed for HDL-based systems. For example, the schematic-based simulation mode for a register or latch differs from that of an AND gate in that it contains a reference to a global reset signal. Similarly, the schematic-based simulation model for an output buffer will contain a reference to a global tristate signal. However, none of these signals will be present on the cell's list of pins when the initial design is entered schematically. Instead, these signals are given "global" status, indicating to the simulator that these signals should be considered to be connected together. The result is that as far as the simulator is concerned, there are two signals in the design that correspond with the global reset and global tristate signals on the target device and designers can simulate these signals as they might any other. In the schematic design environment, these implied connections between all registers, latches and output buffers are understood by the simulator and require no action on the part of the designer.

If the user of a schematic-based system wants to attach a signal to a device's global reset or global tristate network, then the STARTUP cell is added to the design with the appropriate signals attached to its GSR/GR and GTS pins. The schematic-based simulator's simulation model for the STARTUP block is simply a pair of wires from the two pins (GSR/GR and GTS) to the simulator's two global nets, as illustrated in FIG. 6.

The simulation model for the schematic STARTUP block is behaviorally null. Instead, the signals for the global networks of GSR/GR and GTS pins are forced by the simulator's stimulus tool directly and not by a model's output signal. Further, the design implementation tools recognize the schematic STARTUP block as a genuine function on the device silicon and will route the user's signals through the general purpose interconnect to the appropriate access points on the silicon. Thus, with schematic-based tools, the netlist that's written out by the design tool will contain only the details of the user signals that drive the STARTUP block's GSR/GR and GTS pins. The global simulation signals will not be written out into the netlist, and the design implementation tools will not attempt to implement them by routing them through general purpose interconnect. Under these circumstances, the design should simulate and behave identically, as a result of the advantages of the schematic design environment over the available HDL design environment.

All of the functions relating to global networks are required by the HDL designer. However, there is currently no support for global networks in HDL design environments. One complication is the fact that when implemented, a design will be subject to the effects of the target device's global signals regardless of whether their effect was described in the HDL. While this may seem a trivial difference, the repercussions are significant. Whenever the designer describes a sequential function in HDL, every aspect of that function must be explicitly described in the code in order to be sure that no ambiguity arises about the types of flip-flops that should be synthesized. It is therefore impossible to define the initial states of sequential elements within the language limitations imposed by most synthesis tools.

Since the definition of a sequential element's initial, or power-on, state is of some importance, some synthesis tools invite the user to issue commands (in the synthesis tool's own command syntax) with which to assign initial states to sequential elements. However, this is unsatisfactory since such assignments would be made outside of the designer's HDL code, and the code by itself would no longer be intrinsically complete. Such measures also impact a design's portability between synthesis tools since although the HDL code would remain standard, the means of assigning initial states to sequential elements would not.

As stated above and illustrated in FIG. 5, on Xilinx, Inc. FPGAs and CPLDs if registers and latches are required to have an asynchronous clear input, their initial state is Low, and similarly, if they are required to have an asynchronous set input, their initial state is High. However, even provided this assumption, it is still possible to write ambiguous HDL from the simulation and synthesis standpoints. Though these problems can be mitigated somewhat by assigning the registers initial values, there remains a significant chasm between the synthesis and simulation worlds for HDL-based designs since these initial values are ignored for synthesis. The risk of a design's simulated behavior and its real behavior differing is very high and must be accepted unless a design methodology is provided which eliminates the risk.

As can be seen in FIG. 7, once the automated place and route tools have implemented a design, they can write out an HDL netlist that describes the physical implementation of the design and a Standard Delay Format (SDF) data file that describes the design's timing. With these two sources of data, the simulator can be made to model the device's genuine behavior very accurately. However, in order to accurately model the device's initialization behavior, the netlist that's written out by the tools must include a description of the device's global reset and global tristate networks. The presence of these signals in the netlist permits the designer to a) simulate the device's power-on or reconfiguration behavior, and b) simulate the effect of the user asserting either of these signals from an external port or internal logic.

Most HDLs (including VHDL) require the declaration of ports for all signals in a module which are to be monitored, stimulated or otherwise accessed. Inclusion of the global reset and global tristate nets in the back-annotation netlist is the user's means of initializing the simulation, so it is therefore necessary to add ports to the back-annotation netlist through which the user may access these global signals. However, the addition of these ports makes the pre- and post-implementation versions of the design different and the user's original test vectors (or testbench) will no longer be applicable to both versions of the design (since the port lists for the two versions of the design are different, the "socket" in the testbench will only match one of them, so the testbench is only applicable to one version of the design).

This fact alone is enough to rule out the use of available HDL-based tools in many existing design environments, since the only means the designer has to confidently establish whether the implemented design works as intended is through the consistent application of test vectors. To require that the designer keep two versions of the test vectors (regardless of how trivial the differences are) in order to test pre- and post-implementation versions of a design is unrealistic and generates considerable discomfort (and therefore diminished use) among the user community.

There is therefore considerable need in the art for a design tool and method of accurately simulating HDL-based designs in a manner which will take into account the various global signal networks utilized by available programmable devices without burdening the user with otherwise unnecessary limitations.

SUMMARY OF THE INVENTION

To address these challenges, the present invention provides, in an HDL environment for designing a circuit to be implemented in a logic device, the logic device including a global signal network which functions in a manner at least partially independent of the implemented design, a method for simulating and implementing the circuit design in the device comprising the steps of creating a global signal design element including a mechanism for activating the global signal network, adding the global signal design element to an HDL-based design of the circuit, functionally simulating the design, including the global signal design element, synthesizing the design, removing the global signal design element from the synthesized design, and implementing the synthesized design. The present invention further provides a software system for simulating and implementing the circuit design in the device, comprising, a global signal design element including a mechanism for activating the global signal network, the element included in an HDL-based design of the circuit, means for functionally simulating the design, including the global signal design element, and means for removing the global signal design element from the design after the design is synthesized and before the design is implemented.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings in which:

FIG. 9 illustrates a simulation model of the ROC cell element of the present invention;

FIG. 10 provides an example of a VHDL design conforming to a first set of circumstances in which the present invention may be utilized;

FIG. 14 illustrates a simulation model of the ROCBUF cell element of the present invention;

FIG. 15 provides an example of a VHDL design conforming to a second set of circumstances in which the present invention may be utilized;

FIG. 19 illustrates a simulation model of the STARTBUF cell element of the present invention;

FIG. 20 provides an example of a VHDL design conforming to a third set of circumstances in which the present invention may be utilized;

FIG. 24 illustrates a simulation model of the second STARTBUF cell element embodiment of the present invention;

FIG. 25 provides an example of a VHDL design conforming to a fourth set of circumstances in which the present invention may be utilized;

DETAILED DESCRIPTION OF A PREFERRED EMBODIMENT

Figure 1:
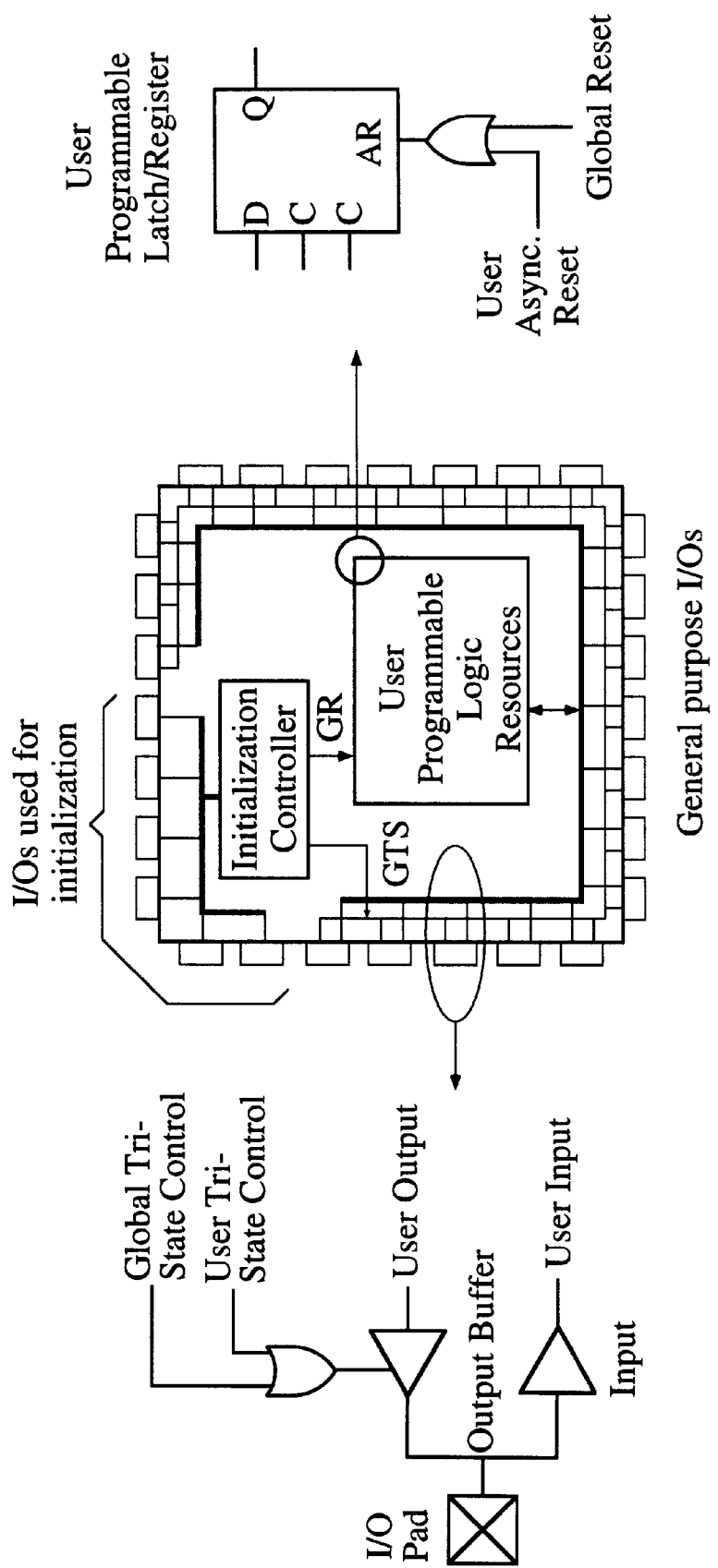
FIG. 1 illustrates the use of global signals in a programmable device.
Figure 2:
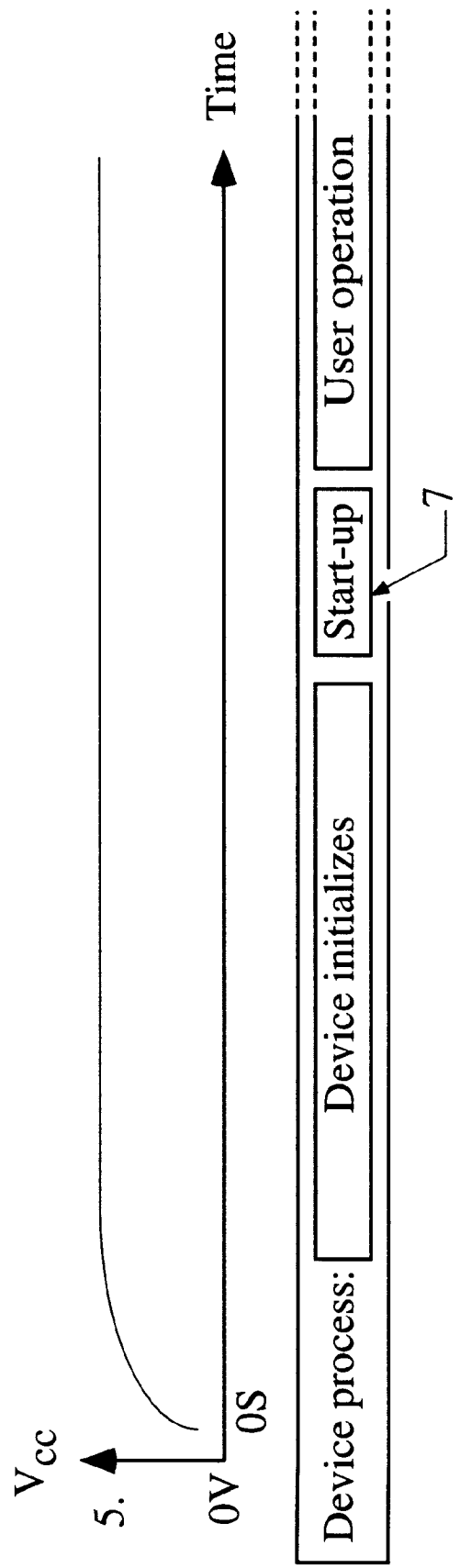
FIG. 2 illustrates the timing of a programmable device initialization process.
Figure 3:
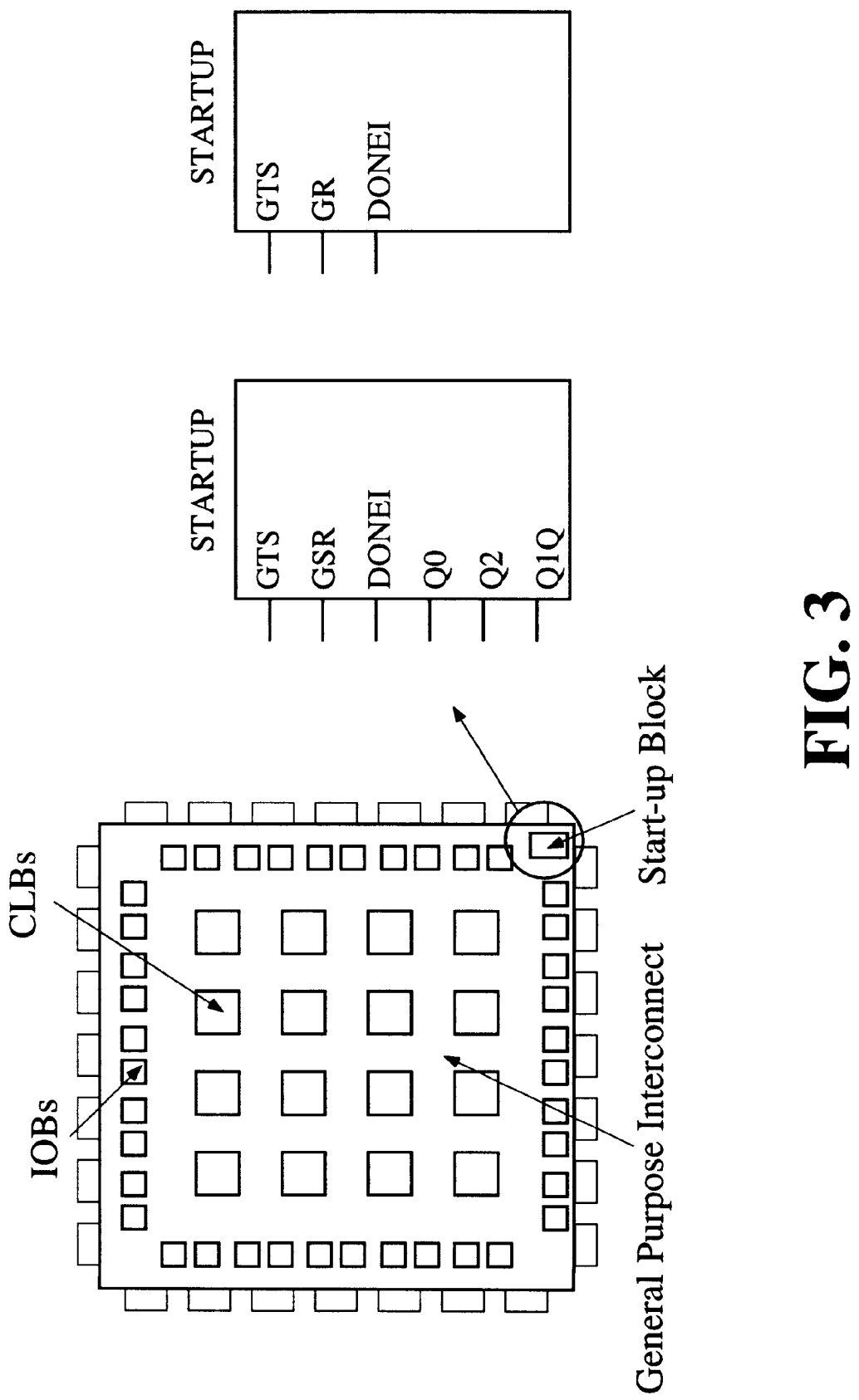
FIG. 3 illustrates STARTUP blocks in a programmable device.
Figure 4:
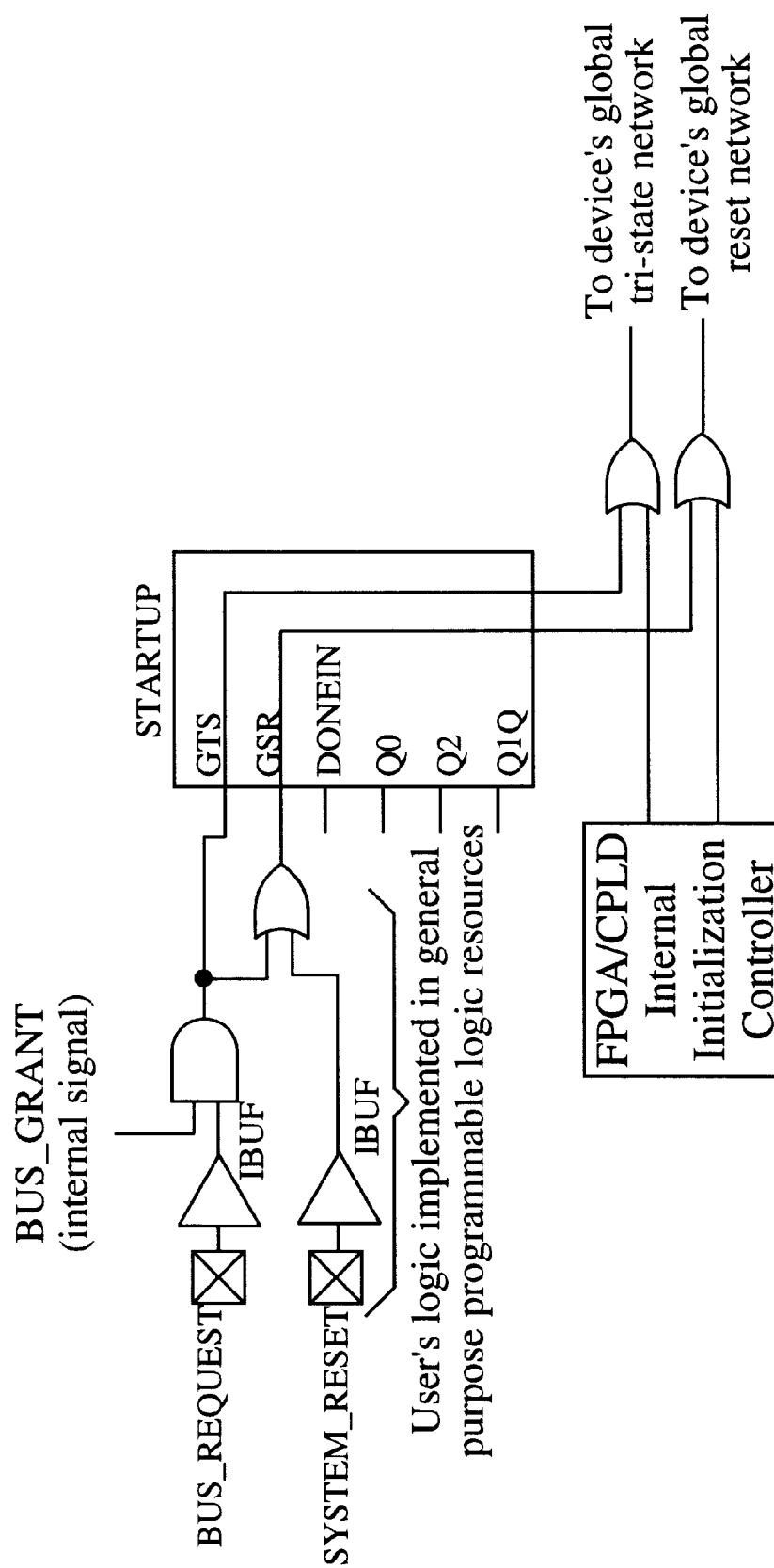
FIG. 4 illustrates an exemplary usage of a STARTUP block.
Figure 5:
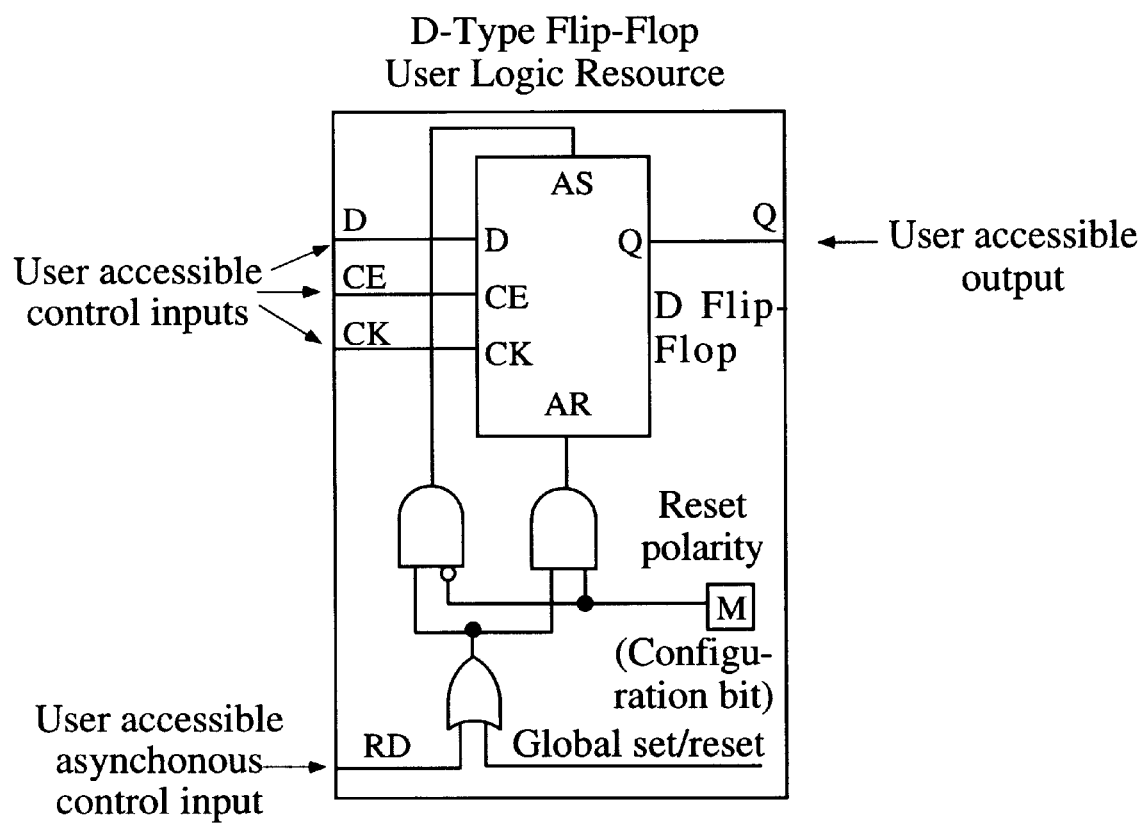
FIG. 5 illustrates the incorporation of a STARTUP block into a programmable register.
Figure 6:
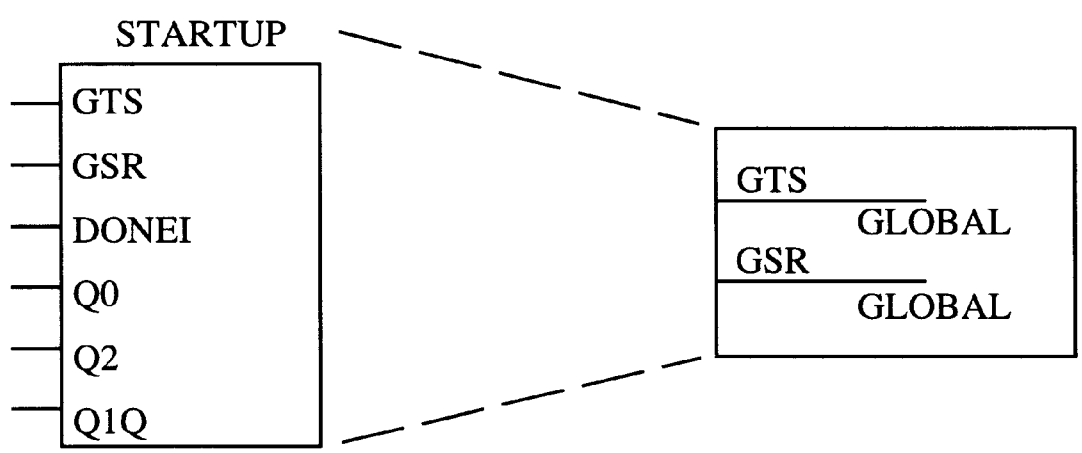
FIG. 6 illustrates a schematic-based simulation model for a STARTUP block.
Figure 7:
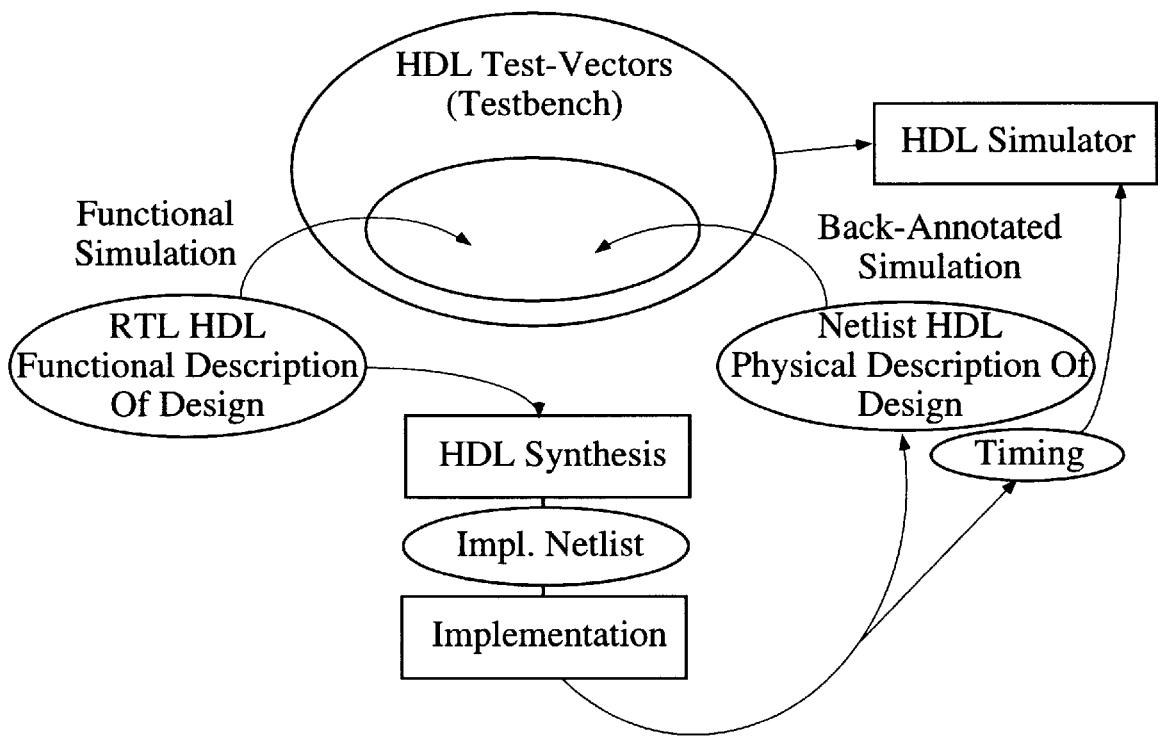
FIG. 7 illustrates the HDL design flow for implementation in a programmable device.

In describing the present invention for defining, simulating and governing the use of a device's global reset or global set/reset networks in an HDL-based design environment, it is useful to consider the ways the user might employ such networks. There are five scenarios in which the user may require some form of global set/reset signal during simulation, synthesis, or both to accurately model and induce proper design implementation.

Scenario #1: Internal Power-on or Reconfiguration Reset Only

In scenario 1, the user is concerned only with the initialization of the sequential elements in a design. The user wants to define the initial states of the design's sequential elements and have those states reflected in the simulation and implementation of the design. Further, the user is not interested in explicitly providing the simulation with any kind of initializing "reset-on-configuration" pulse—i.e., the simulation model should provide its own mechanism for initializing its sequential elements, much as the real device would when power is first applied or the device is reconfigured.

Scenario #2: External Port Simulated, But Not Implemented

In scenario 2, the user wants to define the initial states of the design's sequential elements and have those states reflected in the implemented design and in the simulation of the design, but wants control over the initializing reset-on-configuration pulse without actually implementing a reset pin. For example, scenario 2 would occur where system level issues make the design's initialization synchronous to an off-chip event. The user wants to provide the pulse that initializes the design at the start of simulation time, and may want to provide further pulses as simulation time progresses—perhaps to simulate cycling power to the device. However, while the user wants to provide the reset pulse to the simulation model, no such pulse is required for the implemented device; i.e., no "reset" port is required on the implemented device, but a reset port is required in the RTL code through which the user's reset pulse can be applied during simulation.

Scenario #3: Implemented External Port

In scenario 3, the user desires access to the device's global set/reset network via a port on the design and ultimately wants that port to exist on the implemented device. Such a port might be used to reset the user's design on command, unlike in scenario 2, for example, where the device would only be reset as a result of cycling the power or reconfiguration. In this scenario, both the RTL code and the device itself require a port through which a reset pulse may be applied. (Within the implemented device, sufficient logic and interconnect resources should be employed to connect the design's reset port to the device's global set/reset network.) While the user has the means to apply an initializing "reset-on-configuration" pulse, the design should still take care of initializing itself at the start of simulation time; much as the real device would when power is first applied or the device is reconfigured. If the user wants additional control over the initial "reset-on-configuration" pulse, a port is made available through which a custom pulse may be applied.

Scenario #4: User-defined Internal Reset Signal

In scenario 4, the user wants to drive the device's global set/reset network with the output of a logical function contained within the device. The device may then reset itself as a result of a combinatorial function of one or more of the design's inputs. In this scenario, the availability of a single port on the design through which an initializing "reset-on-configuration" pulse might be applied at the start of simulation time is unlikely since, in most cases, the internal reset signal is a complex decoding of inputs. Consequently, the design will need to generate its own initializing reset pulse (mimicking the device's own initialization behavior) and subsequent resets can only be triggered as a result of the application of the appropriate stimulus. The implemented device must therefore include a logical function combining all the inputs that contribute to the reset event, and an output that is connected via general purpose interconnect to the device's global network.

Scenario #5: Don't Care for Reset Signal

Finally, in scenario 5, the designer is unconcerned with potential simulation/implementation behavior mismatches, and is prepared to tolerate an initial state that's largely unknown by the simulator and assumed by the synthesizer. In this scenario the designer does not incorporate any global set/reset functionality into the RTL code, does not require access to the device's global set/reset network, and does not require any ports on the design through which reset pulses might be applied.

Table 1 provides a quick reference summary of each of the five scenarios described above.

TABLE 1

Global Set/Reset Usage Scenarios

| Scenario | Self Resetting | Reset Port on HDL Entity | Reset Port on Device | User Access to Device's GR/GSR Networks |
|---|---|---|---|---|
| 1 | Y | N | N | N |
| 2 | Y | Y | N | N |
| 3 | Y | Y | Y | Y |
| 4 | Y | N | N | Y |
| 5 | N | N | N | N |

We will now describe a preferred embodiment of the method and system of the present invention in the context of each of these five scenarios.

To address scenario 1, the HDL design includes a description of a signal whose assertion causes the design's sequential elements to behave in the way that the target device's sequential elements are expected to behave upon assertion of the global set/reset network. Describing a register or latch element with an asynchronous set or reset input dictates that element's initialization state when implemented in the target device. Asserting this signal at the start of simulation will therefore initialize the simulator to the same state that the target device will induce with its global network upon power-up or reconfiguration.

Figure 8:
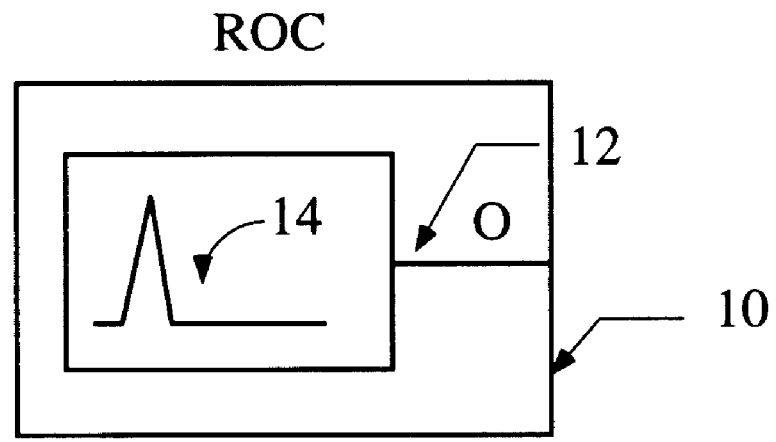
FIG. 8 illustrates the ROC cell element of the present invention.

Referring to FIG. 8, a reset-on-configuration (ROC) cell 10 (similar in function to a power-on reset cell available in ASIC technology, but here applied to a programmable device and therefore also applicable to reconfiguration), is instantiated in the HDL-based design. The sole output 12 of ROC 10 drives the globally setting/resetting signal written into the design's RTL code. During simulation, ROC cell 10 will generate a short duration pulse 14 (preferably user specified) that briefly asserts the global set/reset signal and initializes the design's sequential elements to their well defined initial states. The duration of the ROC cell's output pulse 14, as well as the time at which it is generated, is determined by the user and encoded into the simulation model by the user according to the specification of the targeted device for the cell, as illustrated in FIG. 9.

Figure 11:
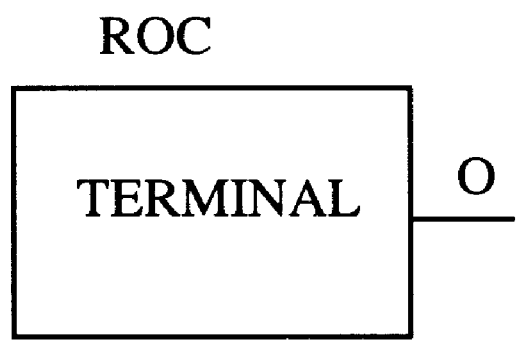
FIG. 11 illustrates an implementation model of the ROC cell element of the present invention.

An example of an HDL-based design that conforms with scenario 1 requirements is listed in FIG. 10. ROC cell 10 is preferably incorporated into the design's netlist during synthesis and drives a net which connects directly to the asynchronous control inputs of all the registers and latches in the design. The physical implementation model for the ROC cell is shown in FIG. 11. The keyword "terminal" shown in FIG. 10 alerts the implemented tool that no further processing is necessary and that the function is basic to the device (i.e., that the element represents the built in global set/reset circuitry). The evolution of a design including a ROC cell through simulation, synthesis and implementation in scenario 1 is outlined in FIG. 12.

As noted in the background discussion above, the ROC cell, the net it drives and the pins on the components to which the net is connected, are all redundant from an implementation point of view since they're only present to provide the simulator with a means of initializing the design's sequential elements. The same function will be performed on the silicon by the dedicated global network which is pulsed at the end of the device's initialization process by its initialization controller. The ROC cell, the net it drives and the pins on the components to which it is connected are therefore removed in the preferred embodiment of the method of the present invention, at some point before implementation, to ensure the design implementation is efficient.

Figure 12:
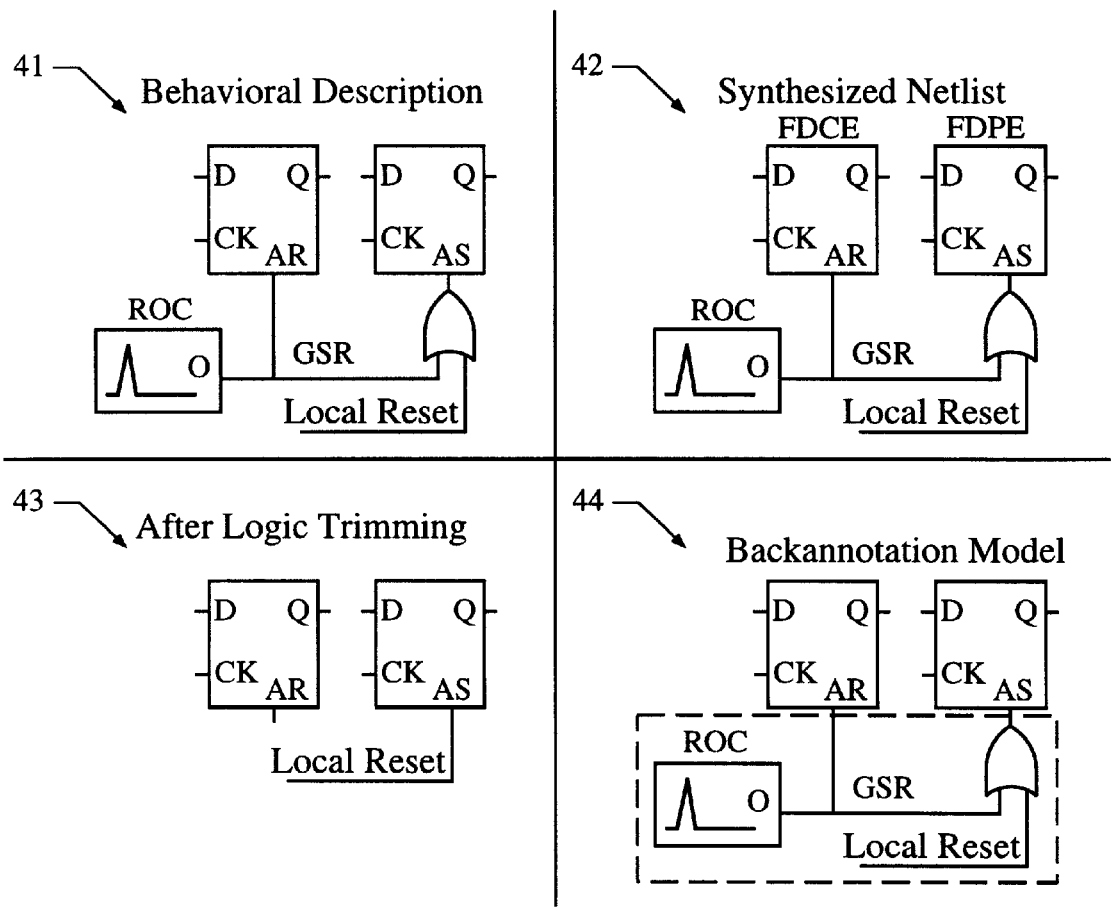
FIG. 12 illustrates a first embodiment of the four major stages of design flow using the method of the present invention.

The removal of these elements from the design is achieved by synthesizing the element to an express ROC cell 10 within the design implementation netlist as a cell with a terminal property, as shown in FIG. 11 and quadrant 42 of FIG. 12. This results in a sourceless (or redundant) net to the local reset of the memory elements which is removed from the design as part of the implementation tools' normal logic trimming process, as shown in quadrant 43. This allows the implementation tool to route a GSR net without regard to local reset. If the net is used in any combinatorial functions (where it might be OR'd with some form of local reset signal, for example, as in scenarios 3 and 4) then these functions are simplified (and logically reduced) by the removal of the sourceless (or redundant) signal. The implementation impact of ROC cell 10 is therefore inconsequential, as can be seen in the equivalence of quadrants 41 and 44 of FIG. 12.

Trimming, the effect of which is illustrated in FIG. 12 at quadrant 43, occurs while mapping the design. Thus, as understood by one skilled in the art to which the present invention pertains, if a user desires to use SIMPRIM (simulation primitive) models instead of Unified Library models for functional simulation, then mapping from logical design entry models to physical design elements followed by back-annotation to timing simulation models must be done before outputting the post-route SIMPRIM netlist.

During the back-annotation step of the method of the present invention, a structural HDL model is created that describes the behavior of the implemented version of the design. In this manner, the ROC element and necessary logic are reintroduced into the implemented circuit after logic trimming. At the same instant, an accompanying SDF file (not shown) is also created that contains timing information arising from the physical implementation of the design. Since the back-annotator finds that the user has not included a STARTUP block in the design or used it for functions other than defining the reset signal, when the back-annotator adds the global set/reset network to the back-annotation model, it attaches this signal to the output 12 of a ROC cell. Back-annotation simulation is therefore initialized in the same fashion as the front-end RTL simulation—by a brief pulse that's generated at the start of simulation time by a ROC cell. Both front-end and back-end simulation may therefore be performed using the same testbench since the port maps on both the pre- and post-implementation versions of the design are the same, and the two designs will initialize themselves in the same fashion.

Figure 13:
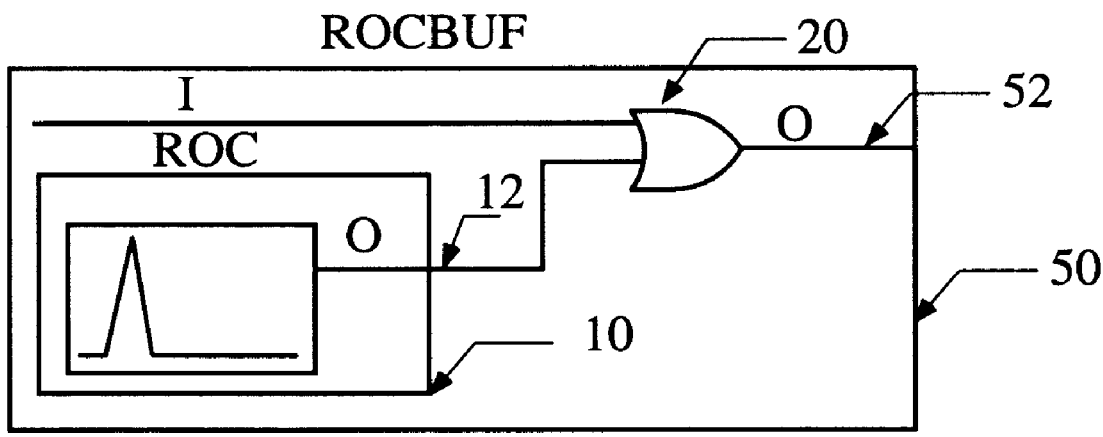
FIG. 13 illustrates the ROCBUF cell element of the present invention.

In scenario 2, an input port is described in the design on the HDL entity which is connected to the input of an instantiation of a ROCBUF 50, illustrated in FIG. 13. The output 52 of the ROCBUF's assertion should cause the design's sequential elements to behave in the way that the target device's sequential elements would behave on assertion of its global set/reset network. As discussed above, describing a register with an asynchronous set or reset control dictates the register's initialization state when implemented in the target device. Asserting this port at the start of simulation will therefore initialize the simulator to the same state that the target device will assume on power-up or reconfiguration. In a preferred embodiment, the user will assign some arbitrary name to this port and include it on the HDL entity's port map. The names "GSR" (Global Set/Reset) or "GR" (Global Reset) will be assigned to the output of the ROCBUF, depending on the global network technology available. Via this global network port the user can initialize the design during simulation by providing an appropriately timed pulse, and optionally provide subsequent pulses to reset the design later in the simulation. (This may be used to model cycling the power to the device or reconfiguring the device, for example). An example of including the global network port in the HDL code for scenario 2 can be found in the code listing of FIG. 15.

The user simulation port will not become a port on the implemented device but is intended only for use during simulation as a means of modeling the target device's global set/reset behavior. The user instantiates a cell called ROCBUF with its input attached to the user simulation port and its output driving the design's global set/reset signal. During simulation, the ROCBUF passes the signal described on the port to the local reset of the registers and initializes them. The duration of the ROCBUF cell's output pulse, and the time at which it is generated, is encoded into the simulation model for the cell in a manner specified by the user within the parameters set by the specifications for the targeted device, as illustrated in FIG. 14. An example of a design that conforms with scenario 2 requirements is shown in FIG. 15.

Figure 17:
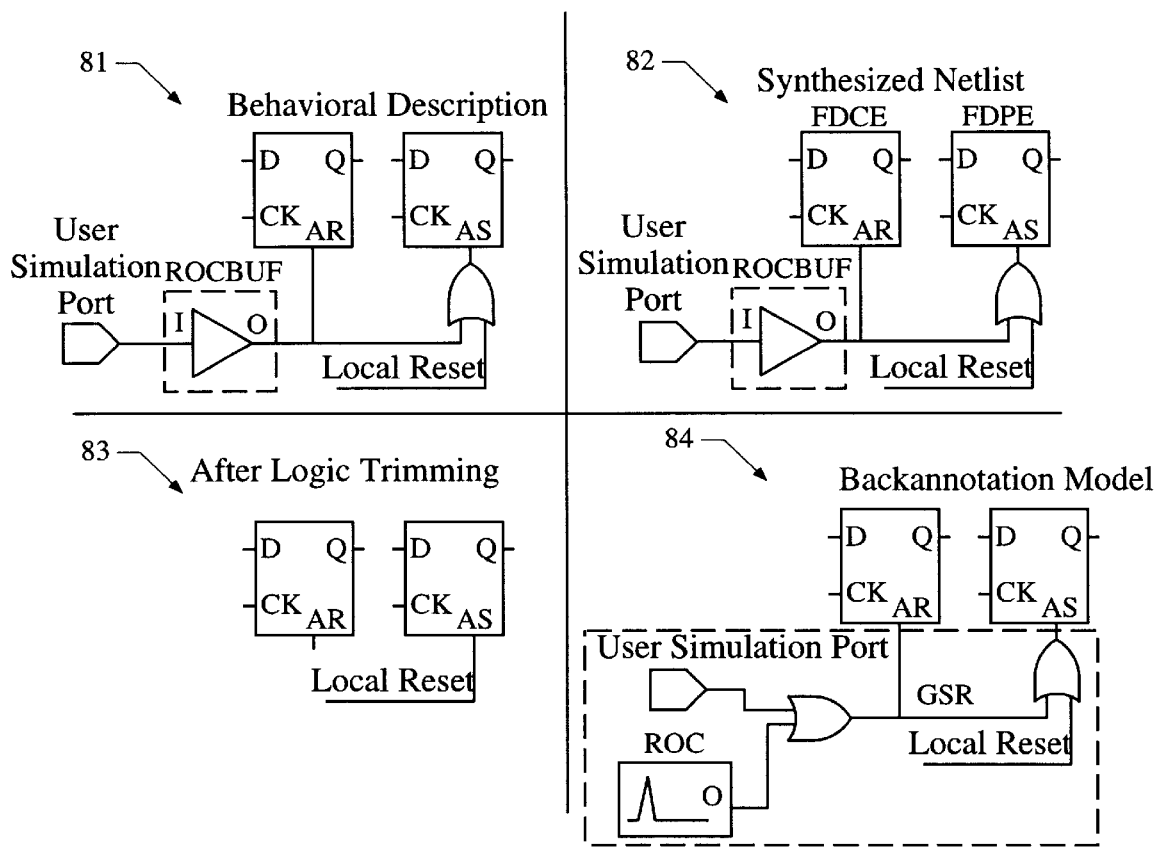
FIG. 17 illustrates a second embodiment of the four major stages of design flow using the method of the present invention.

The ROCBUF cell manifestation in the RTL description is illustrated in FIG. 17, quadrant 81. The ROCBUF cell is incorporated into the design's netlist during synthesis and drives a net which connects either directly to the asynchronous control inputs of all the registers and latches in the design, or is OR'd with some local reset signal that controls one or more group(s) of registers or latches, as shown in FIG. 17, quadrant 82. The ROCBUF cell, the port attached to its input, the signal attached to its output, and the pins on the components to which the signal is connected, are all redundant from an implementation point of view since they're only purpose is to provide the simulator and/or user with a means of initializing the design's sequential elements for simulation. The same function will be performed on the silicon by the dedicated global reset net which is pulsed at the end of the device's initialization process by its initialization controller. The ROCBUF cell, the port attached to its input, the net attached to its output, and the pins on the components to which it is connected are therefore removed to ensure, as preferred, an efficient implementation of the design.

The removal of these elements from the design is achieved by expressing the ROCBUF cell (within the design implementation tools) as a cell with a terminal property. This results in loadless and sourceless (or redundant) nets which are removed from the design as part of the implementation tools' normal logic trimming process as outlined above and illustrated in FIG. 17, quadrant 83. If the net attached to the ROCBUF's output pin is used in any combinatorial functions (where it might be OR'd with some form of local reset signal as in scenarios 3 and 4, for example) then these functions are simplified (and logically reduced) by the removal of the sourceless (or redundant) signal. The port and net attached to the ROCBUF's output pin is removed because the ROCBUF's cell is marked as a terminal cell indicating that further processing is not necessary since the functionality is built in. The simulation-only "ROC" port, included in the simulation model of FIG. 14, is therefore removed from the design's netlist and does not appear on the target device. The port can be reintroduced for simulation-only purposes during back-annotation by a command request to the back-annotation tool. The implementation impact of the ROCBUF cell is therefore negligible, as can be seen in the functional similarity of quadrants 81 and 84 in FIG. 17.

During the back-annotation process, a structural HDL model is created that describes the behavior of the implemented version of the design. At the same instant, an accompanying SDF file is also created that contains timing information arising from the physical implementation of the design. Since the back-annotator finds that the user has not included the STARTUP block in the design, when it adds the global set/reset network to the back-annotation model it would normally attach this signal to the output of a ROC cell. However, this would result in a mismatch with the original HDL code which had a user simulation port through which the user's testbench gained access to the design's global set/reset signal. Such a mismatch would make the testbench used for the "front-end" simulation inapplicable to the "back-end" —invalidating the whole methodology.

So instead, when using the methodology of the present invention, the user adds an optional command line switch to the back-annotator that causes it to add a port to the back-annotation structural netlist having the same arbitrary name as in the user's original RTL description. This port, just like the front-end version of the design, drives the global set/reset network via the equivalent of a ROCBUF cell—i.e. a ROC cell 10 and an OR gate 20, as shown in FIG. 13. (This differs from the back-annotator's default action of driving the global set/reset net with a ROC cell when there's no STARTUP cell in the design.) Back-annotation simulation is therefore initialized in the same fashion as the front-end RTL simulation—by a brief pulse that's generated at the start of simulation time by the ROCBUF. Alternatively, the user's testbench might also provide either initializing, or subsequent reset pulses. However, both front-end and back-end simulation may be performed using the same testbench since the port maps on both the pre- and post-implementation versions of the design are the same, and the two designs will initialize themselves in the same fashion.

Figure 16:
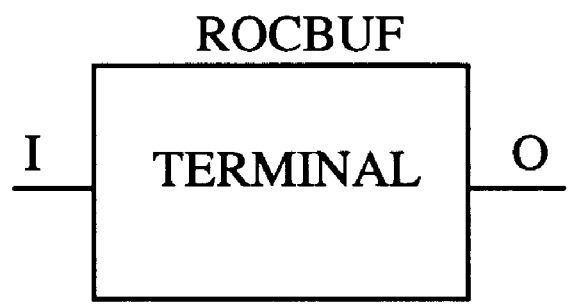
FIG. 16 illustrates an implementation model of the ROCBUF cell element of the present invention.

The physical implementation model for the ROCBUF cell as described above is shown in FIG. 16.

In scenario 3, an input port is described in the HDL entity, the assertion of which causes the design's sequential elements to behave in the way that the target device's sequential elements should behave upon assertion of its global set/reset network. The act of describing a register with an asynchronous set or reset control dictates the register's initialization state when implemented in the target device. For example, a "D" flip-flop including a clock enable (FDCE) is chosen for a reset signal and a similar flip-flop include a preset (FDPE) is chosen for a set signal. Each of these elements is illustrated in quadrants 42, 82, 122 and 162 of FIGS. 12, 17, 22 and 27, respectively. Asserting this port at the start of simulation will therefore initialize the simulator to the same state that the target device will assume on power-up or reconfiguration. The user is free to assign any name to this port since it will ultimately become a pin of the same name on the implemented device. Via this port the user can a) take control of the design's initialization during simulation, b) arbitrarily reset the design during simulation, and c) apply reset pulses to the physical, implemented device.

Figure 18:
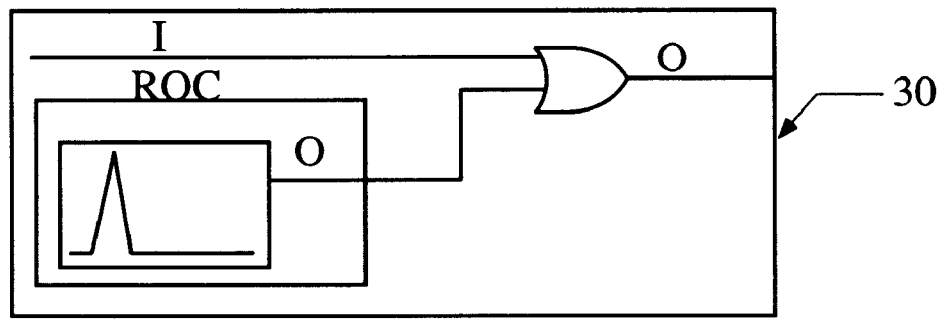
FIG. 18 illustrates a first embodiment of the STARTBUF cell element of the present invention.

The user then instantiates a STARTBUF cell with its input attached to the desired set/reset port and its output driving the design's global set/reset signal. STARTBUF cell 30 is illustrated in FIG. 18. During simulation, STARTBUF cell 30 will allow the GSR or GR signal to be simulated through emulation. Emulation is achieved by connecting the signal to the local reset of the register since the local reset is an accessible pin and the GSR pin is not. The duration of the STARTBUF cell's output pulse, and the time at which it is generated, are predetermined and encoded into the simulation model by the user after consulting the targeted device's specifications for the GSR ports for the cell, as shown in FIG. 19.

An example of a design that conforms with scenario 3 requirements is shown in FIG. 20. STARTBUF cell 30 is incorporated into the design's netlist during synthesis and drives a net which connects either directly to the asynchronous control inputs of all the registers and latches in the design, or is perhaps OR'd with some local reset signal that controls one or more group(s) of registers or latches. The net attached to the output of the STARTBUF cell, and the pins on the components to which the net is connected, are all redundant from an implementation point of view since they're only there to provide the simulator and/or user with a means of initializing the design's sequential elements for simulation. The same function will be performed on the silicon by the dedicated global reset net which may be a) pulsed at the end of the device's initialization process by its initialization controller, and/or b) pulsed by a hardware signal that drives the design's reset port. The implementation software will remove the redundancy.

Figure 21:
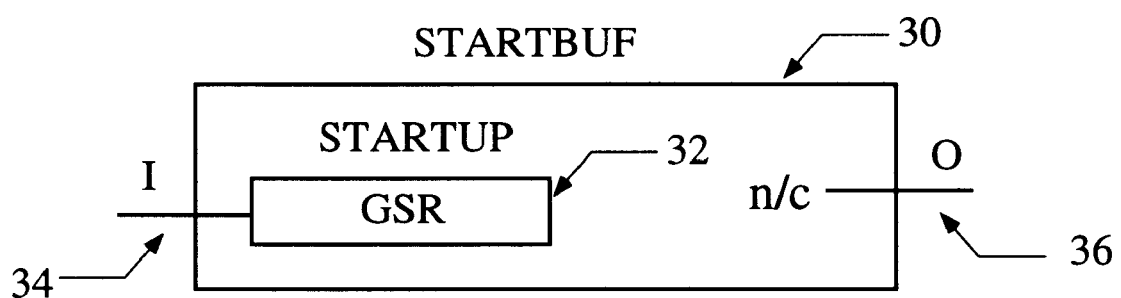
FIG. 21 illustrates an implementation model of the STARTBUF cell element of the present invention.
Figure 22:
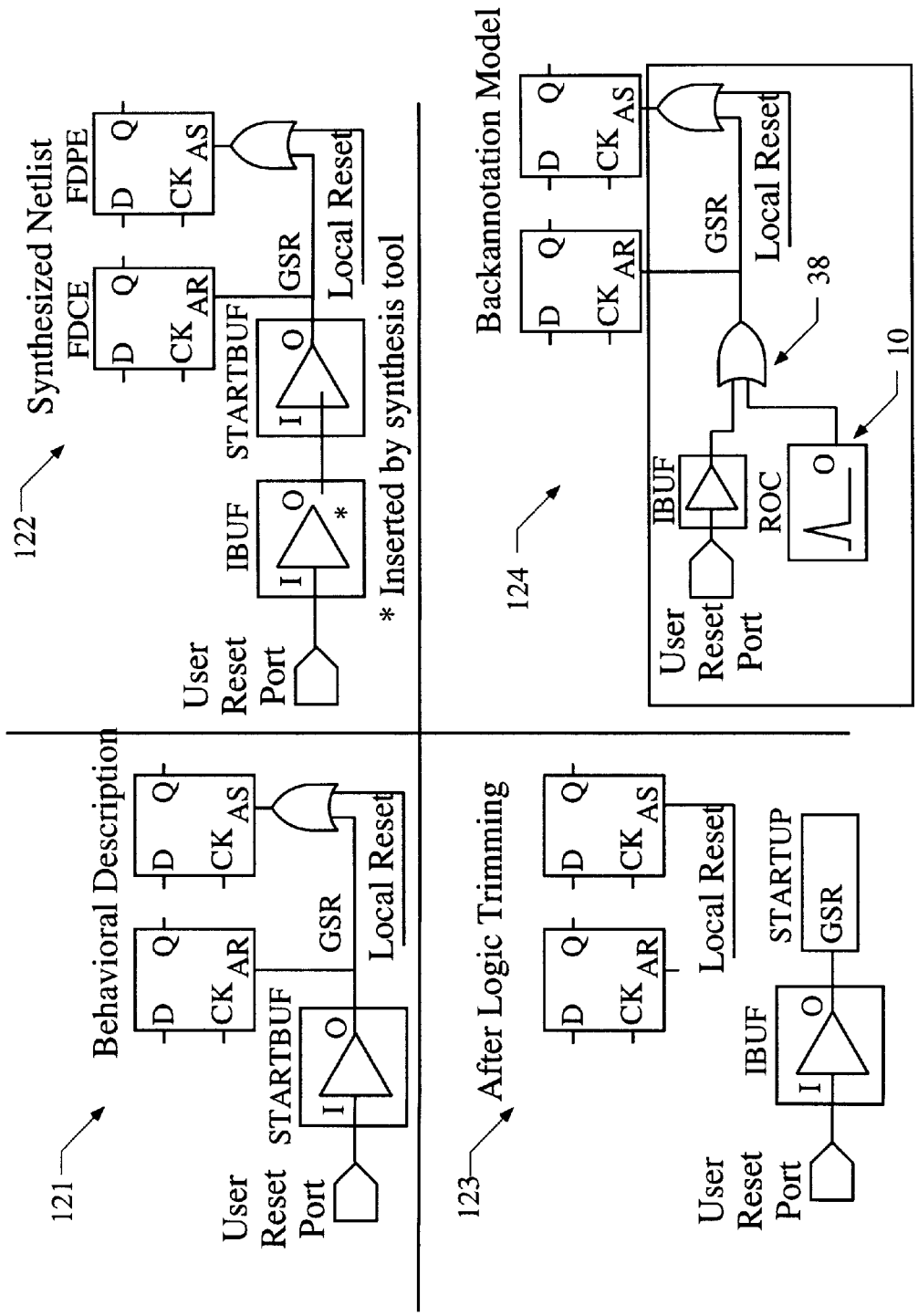
FIG. 22 illustrates a third embodiment of the four major stages of design flow using the method of the present invention.

The STARTBUF cell's input pin 34, shown in FIG. 21, should be driven by a port on the HDL entity's port list, as shown in FIG. 20. This port will ultimately become a port on the target device and should therefore be treated no differently (from a synthesis point of view) from any of the other ports in the design (i.e., the synthesis tool should be informed that this is a chip-level I/O port and that the appropriate input buffering should be inserted). The physical implementation model of a STARTBUF, shown in FIG. 21, also includes a STARTUP cell 32 whose GSR input is driven by the STARTBUF's input pin 34. The signal attached to this pin will therefore drive the target device's global set/reset network.

The signal forwarded to the STARTBUF's output pin 36, and the pins on the components to which it is connected, must be removed at some point during the design implementation process to ensure an efficient implementation of the design. These elements are removed by expressing the STARTBUF cell 30 (within the design implementation tools) as a STARTUP cell with the GSR pin tied to the input of the STARTBUF and an unconnected output. This results in a sourceless (or redundant) net which is removed from the design as part of the implementation tools'normal logic trimming process, as illustrated in quadrants 121–123 of FIG. 22. If the net attached to the STARTBUF's output pin is used in any combinatorial functions (where it might be OR'd with some form of local reset signal, for example) then these functions are simplified (and logically reduced) by the removal of the sourceless (or redundant) signal. The implementation impact of the STARTBUF cell—besides the link from the design's reset port to the STARTUP block's GSR pin—is therefore negligible, as illustrated by the similarity of quadrants 121 and 124 of FIG. 22.

During the back-annotation process, a structural HDL model is created that describes the behavior of the implemented version of the design. At the same instant, an accompanying SDF file is also created that contains timing information arising from the physical implementation of the design. Since the back-annotator finds that the user has included the STARTUP block in the design (as a result of instantiating the STARTBUF cell), when the back-annotator adds the global set/reset network to the back-annotation model, it drives them with the signals that drive the STARTUP block's GSR pin. Since, in the case of the GSR pin, this corresponds with the signal that the user attached to the input of the STARTBUF, the back-end simulation model will be reset by asserting the same input port as in the front-end simulation.

However, while this approach addresses reset pulses generated by the testbench and applied to the design's reset port, the back-annotated simulation model must still look after its own initialization. To this end, upon encountering a STARTUP block in the user's design, the inventive back-annotator also incorporates a ROC cell 10 (which generates a short-duration pulse at the start of simulation time), as shown in quadrant 124, FIG. 22, and an OR gate with which the ROC cell's output is combined with the user's global set/reset signal.

Back-annotation simulation is therefore initialized in the same fashion as the front-end RTL simulation—by a brief pulse that's generated at the start of simulation time by the ROC cell 10. Alternatively, the user's testbench might also provide either initializing or subsequent reset pulses. However, both front-end and back-end simulation may be performed using the same testbench since the port maps on both the pre- and post-implementation versions of the design are the same, and the two design simulations will initialize themselves in the same fashion.

In scenario 4, a signal is described in the HDL code, the assertion of which causes the design's sequential elements to behave in the way that the target device's sequential elements should behave on assertion of its global set/reset network. The act of describing a register with an asynchronous set or reset control dictates the register's initialization state when implemented in the target device. Asserting this signal at the start of simulation will therefore initialize the simulator to the same state that the target device will assume on power-up or reconfiguration. Asserting this signal at any time during simulation will return the design's sequential elements to their initial states. The user is free to assign any name to this signal since the name will be preserved because of its attachment to the input of a STARTBUF, though the STARTBUF output signal will ultimately be trimmed from the design and not appear within the implemented device. Instead, the target device's dedicated global set/reset network will be used to implement the signal's functionality.

Figure 23:
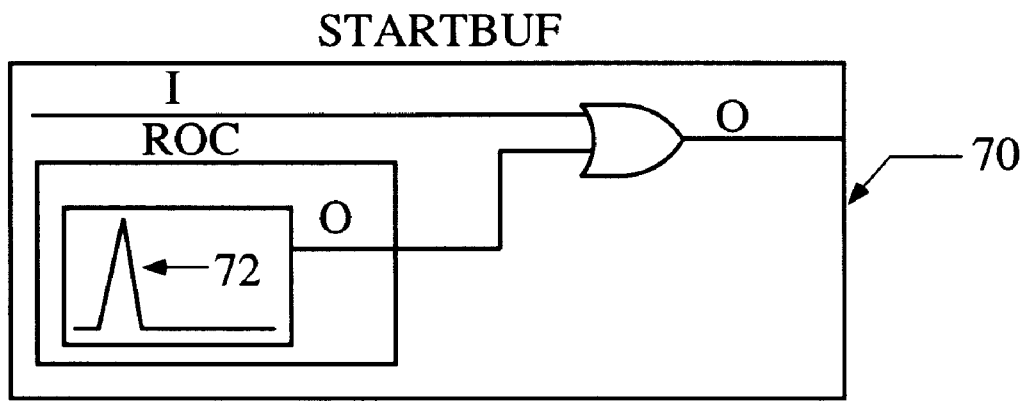
FIG. 23 illustrates a second embodiment of the STARTBUF cell element of the present invention.

The user should instantiate a STARTBUF cell 70, illustrated in FIG. 23, with its input driven by the logical function which detects the desired global reset condition, and its output driving the design's globally setting/resetting signal. During simulation, STARTBUF cell 70 will generate a short duration pulse 72 that briefly asserts the global set/reset signal and initializes the design's sequential elements. The duration of the STARTBUF cell's output pulse 72, and the time at which it is generated, are predetermined and encoded into the simulation model by the user after consulting the targeted device's specifications for the GSR ports for the cell, as shown in FIG. 24.

An example of an HDL design that conforms with scenario 4 requirements is shown in FIG. 25. The STARTBUF cell is incorporated into the design's netlist during synthesis and drives a net which connects either directly to the asynchronous control inputs of all the registers and latches in the design, or is perhaps OR'd with some local reset signal that controls one or more register or latch groups. The net attached to the output of the STARTBUF cell, and the pins on the components to which the net is connected, are all redundant from an implementation point of view since they're only there to provide the simulator and/or user with a means of initializing the design's sequential elements for simulation. The same function will be performed on the silicon by the dedicated global set/reset net which may either a) be pulsed at the end of the device's initialization process by its initialization controller, and/or b) be pulsed by a logical function driving the GSR input on the STARTUP block.

The STARTBUF cell's input pin should be driven by the result of a logical function that is derived from ports on the design. (It makes little sense to incorporate register outputs into this function since the registers would be reset by the function's output.) This logical function will ultimately be implemented on the target device and should therefore be treated no differently (from a synthesis point of view) from any of the design's other combinatorial functions. Since the physical implementation model of a STARTBUF includes a STARTUP cell whose GSR input is driven by the STARTBUF's input pin, the logical function driving the input to the STARTBUF drives the target device's global set/reset network.

Figure 27:
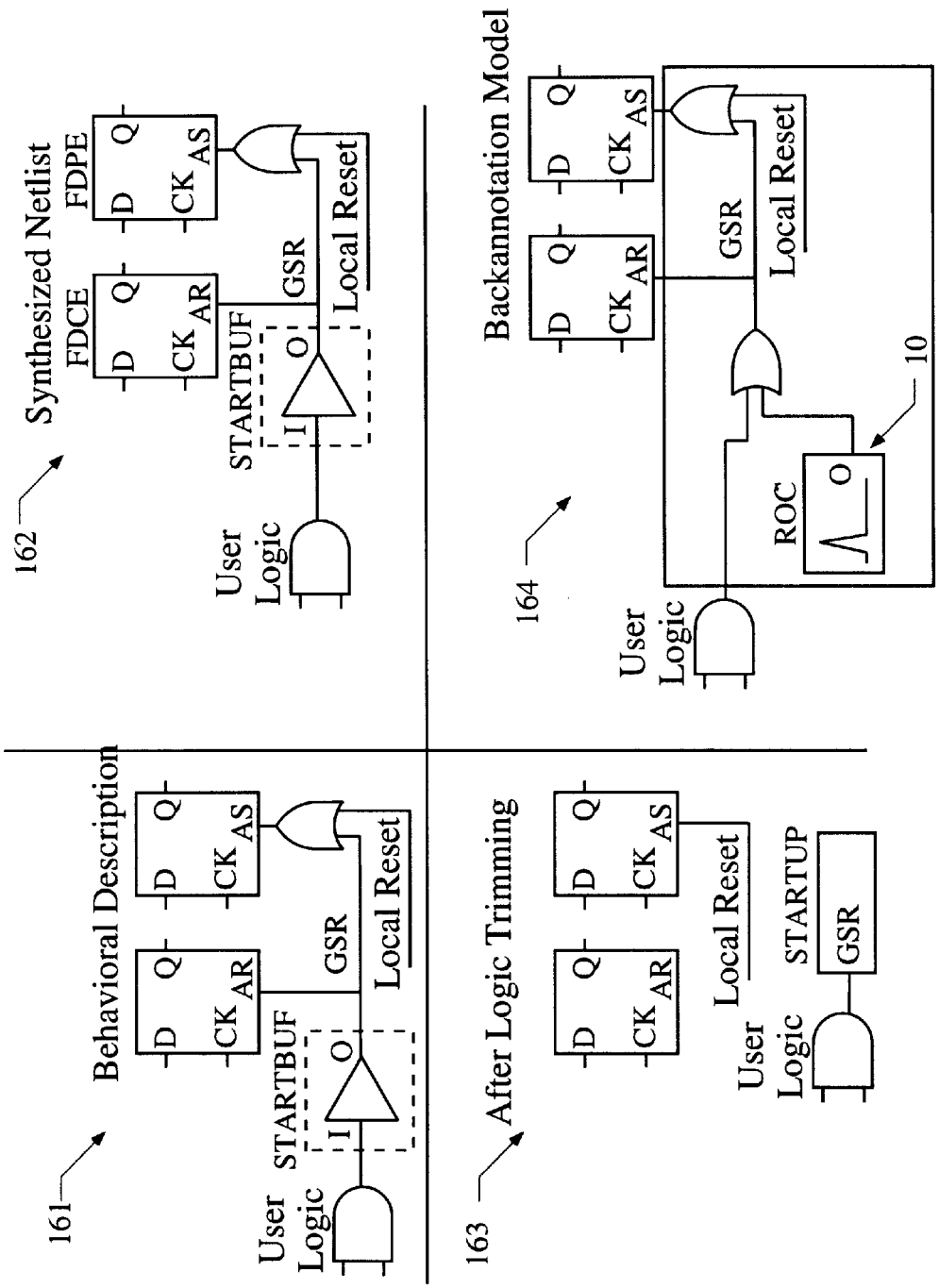
FIG. 27 illustrates a fourth embodiment of the four major stages of design flow using the method of the present invention.

The signal attached to the STARTBUF's output pin, and the pins on the components to which it is connected must be removed at some point during the design implementation process to ensure an efficient implementation of the design. The removal of these elements is achieved by expressing the STARTBUF cell (within the design implementation tools) as a cell with an open circuit (or possibly grounded) output. This results in a sourceless (or redundant) net which is removed from the design as part of the implementation tools'normal logic trimming process. If the net attached to the STARTBUF's output pin is used in any combinatorial functions (where it might be OR'd with some form of local reset signal, for example) then these functions are simplified (and logically reduced) by the removal of the sourceless (or redundant) signal, as illustrated in FIG. 27, quadrants 161–163. The implementation impact of the STARTBUF cell—beyond the combinatorial function that drives the STARTUP block's GSR pin—is therefore reduced to almost zero, as illustrated by the functional similarity of quadrants 161 and 164 in FIG. 27.

During the back-annotation process, a structural HDL model is created that describes the behavior of the implemented version of the design. At the same instant, an accompanying SDF file is also created that contains timing information arising from the physical implementation of the design. Since the back-annotator finds that the user has included the STARTUP block in the design (as a result of instantiating the STARTBUF cell), when it adds the global set/reset network to the back-annotation model it drives them with the signals that it finds to be driving the STARTUP block's GSR and GTS pins respectively. Since, in the case of the GSR pin, this corresponds with the signal that was attached to the input of the STARTBUF, the back-end simulation model will be reset by the same combinatorial function as in the front-end simulation.

However, while this approach addresses reset pulses generated by the testbench and applied to the design's reset ports, the back-annotated simulation model must still look after its own initialization. To this end, upon encountering a STARTUP block in the user's design, the back-annotator also incorporates a ROC cell (which generates a short-duration pulse at the start of simulation time) and an OR gate with which the ROC cell's output is combined with the user's global set/reset signal, as shown in FIG. 27 at quadrant 164.

Back-annotation simulation is therefore initialized in the same fashion as the front-end RTL simulation—by a brief pulse that's generated at the start of simulation time by the ROC cell. Alternatively, the user's testbench might also provide either initializing, or subsequent reset pulses. However, both front-end and back-end simulation may be performed using the same testbench since the port maps on both the pre- and post-implementation versions of the design are the same, and the two designs will initialize themselves in the same fashion.

Figure 26:
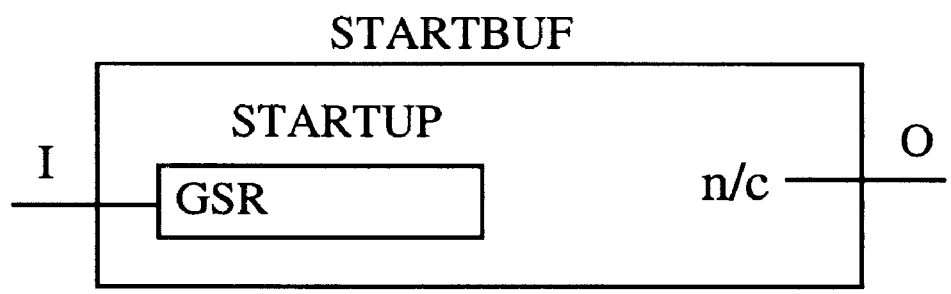
FIG. 26 illustrates an implementation model of the second STARTBUF cell element embodiment of the present invention.

The physical implementation model for the STARTBUF cell is shown in FIG. 26. The preferred sequence of events that occur during the scenario 4 flow are outlined in FIG. 27.

Scenario 5 is encountered when the designer is not concerned with the risks of simulation/implementation behavior mismatches. As such, the designer need not describe any kind of globally setting/resetting signal in their HDL code; instead, the synthesis tool relies on its default settings when selecting registers from the synthesis library. (Most synthesis libraries are organized so that sequential elements with an initial Low value are synthesized.) However, since the HDL itself does not convey the design's initial conditions, the HDL simulator will reflect this by assigning the appropriate initial values to the design's sequential elements according to the language's own conventions.

Whatever the user's intent regarding initialization, the process of implementing and back-annotating a design results in the introduction into the back-annotated simulation model of the target device's two global networks. Depending on the presence/absence of the STARTUP cell in the design, the back-annotator will assume either scenario 1 or scenario 3 functionality. Scenario 1 behavior occurs when the STARTUP cell is not present in the design, so the back-annotator drives the two global networks with the outputs of ROC cells in order to initialize the simulation at the start of time. Scenario 3 behavior occurs when the STARTUP cell is present and signals are attached to either of its GSR/GR and GTS pins. In this scenario, the back-annotator drives the global networks with the signals attached to the appropriate pins through an OR gate, the other OR gate input being driven by a ROC cell. Thus, the signals that the user intended to drive the global networks OR the output of a ROC cell and actually drive the GSR/GR and GTS networks. If the STARTUP cell is present in the design but neither of its GSR/GR or GTS pins are driven, then the corresponding network is simply driven by a ROC cell.

Figure 28A:
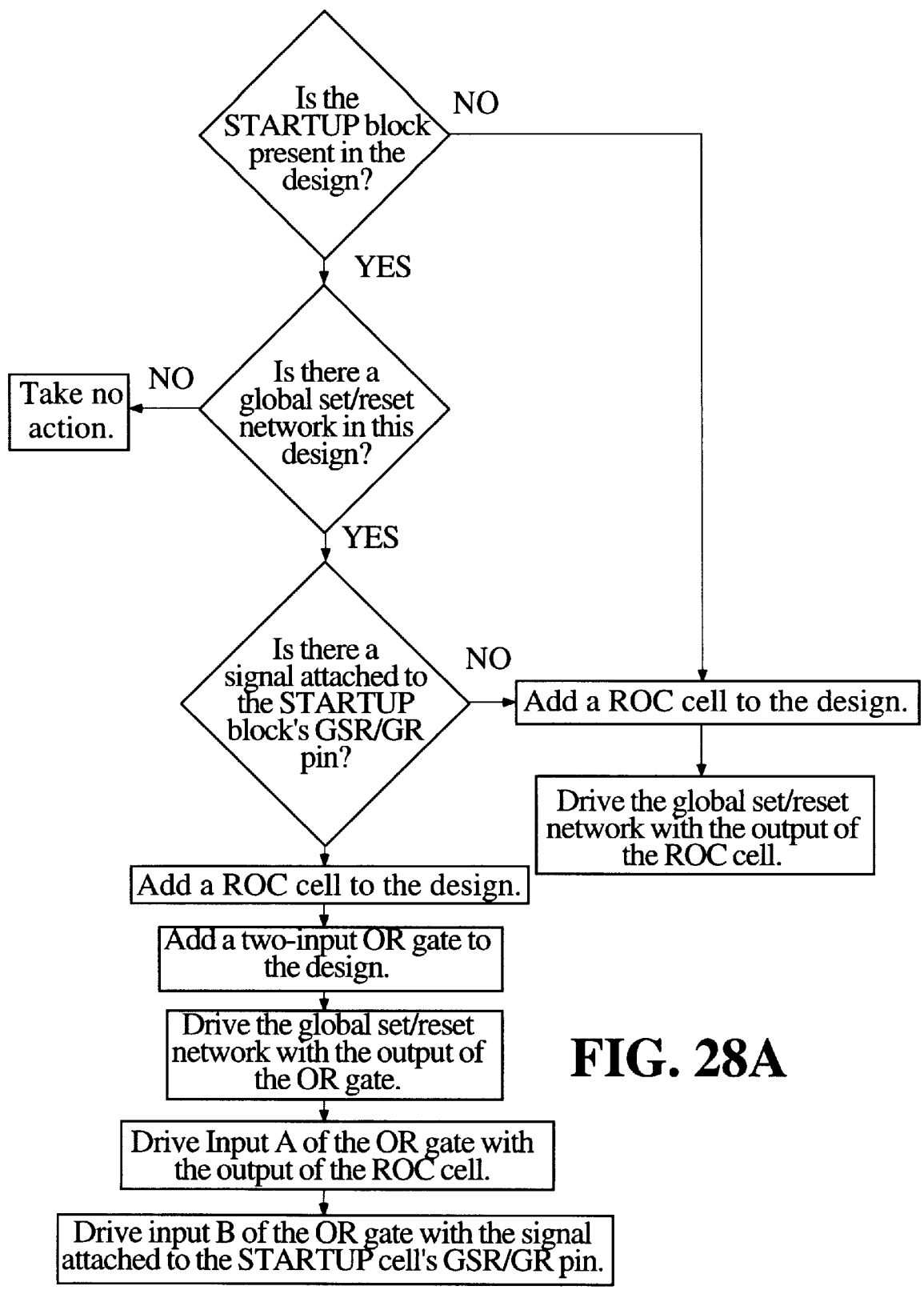
FIG. 28A provides a flow chart illustrating the function of the back-annotator of the present invention for the global set/reset network.
Figure 28B:
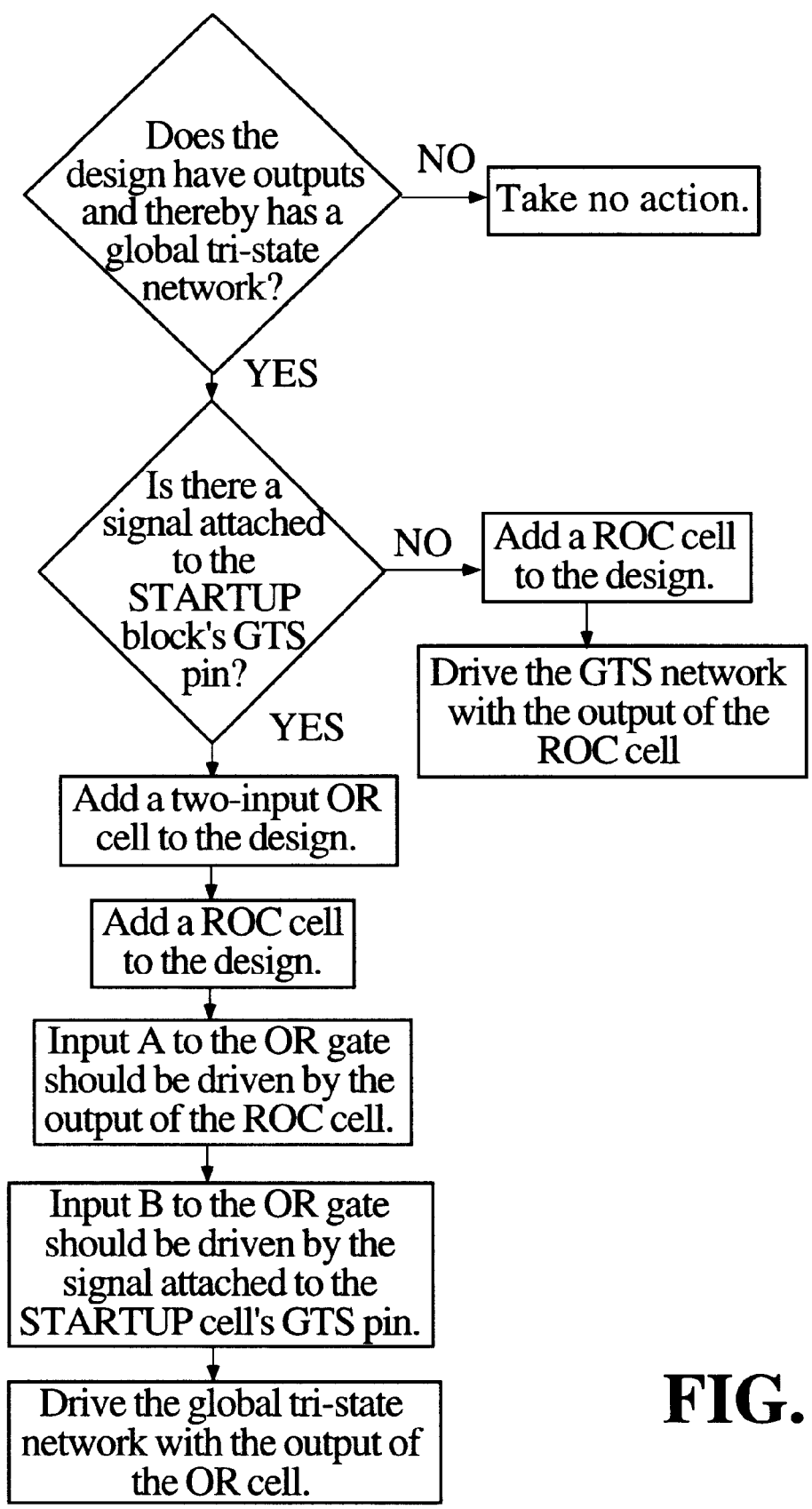
FIG. 28B provides a flow chart illustrating the function of the back-annotator of the present invention for the global tristate network.

The actions taken by the back-annotator of the present invention for the five scenarios described above are summarized in the flow charts of FIGS. 28A and 28B.

It should be understood that the inventive methodology described above relies on several factors for its implementation. One such factor is the use of a register's asynchronous control input to determine its initial value. To control an entire design's initial state therefore requires that every register in the design be given an asynchronous control input. While this condition satisfies the criteria for successfully initializing a design during simulation, it imposes a significant limitation on synthesis, that is, since every register in the design is described as having an asynchronous control input, those registers in the synthesis library that do not have such an input are excluded from consideration during synthesis. Input and output registers are notable sequential cells excluded by this methodology, since these have no asynchronous control input.

While the proposed methodology requires the designer to attach every sequential element in the design to a globally setting/resetting signal, the user may choose to leave some registers detached in cases where it would prevent the synthesis of the desired cell (as in the case of sequential cells with no asynchronous control input). Those registers that are left detached from the global set/reset net are subject to potential simulation/implementation behavior mismatches, and an alternative means of controlling the register's initial state is required (usually supplied by the synthesis tool).

Also, the preferred embodiment does not necessarily perform DRC (design rule) checking to ensure that the designer has followed all the rules. Thus, an easy mistake for a user to make would be to attach the output of a ROC cell, a STARTBUF cell, or a ROCBUF cell to something other than the asynchronous control pin of a register. Since the output of any of these cells is intended to mimic the target device's global set/reset network, such a connection is illegal. The result of such a mistake would be inaccurate simulation, since the nets attached to the outputs of such cells are going to be trimmed during design implementation. One location where it is safe to attach the output of such a cell to a pin other than the asynchronous control input of a register is the input of a combinatorial function which ultimately fans in and drives the asynchronous control pin of a register.

While the present invention has been described with reference to certain preferred embodiments, those skilled in the art will recognize that various modifications and other embodiments may be provided. For example, the global tristate network may be simulated and controlled in nearly the same fashion as outlined above, with only minor modifications which will be apparent to one skilled in the art to which the present invention pertains. Alternatively, the method of the present invention could be used to simulate use of the global network in only a defined area of a device to enable partial reconfiguration. Or the method of the present invention could be applied to simulating the on-chip oscillator found in some programmable devices and accessible across a global network similar to those discussed above. These and other embodiments are intended to fall within the scope of the present invention. Additional use scenarios might also become valuable for the user. All such potential scenarios for use of the inventive method are within the scope of the invention. These and other variations upon and modifications to the embodiment described herein are provided for by the present invention which is limited only by the following claims.

We claim:

1. In a Hardware Description Language (HDL) environment for designing a circuit to be implemented in a logic device, the logic device including a global signal network which functions in a manner at least partially independent of the implemented design, a method for simulating and implementing the circuit design in the device, said method comprising the steps of:

creating a global signal design element including a mechanism for activating the global signal network;

adding said global signal design element to an HDL-based design of the circuit;

functionally simulating said design, including said global signal design element;

synthesizing said design;

removing said global signal design element from said synthesized design; and implementing said synthesized design.

2. The method of claim 1, wherein said global signal network is capable of setting the state of a plurality of sequential logic elements on the device.

3. The method of claim 1, wherein said global signal network is capable of electrically isolating a plurality of outputs from the device.

4. The method of claim 1, wherein said global signal network is capable of activating a global oscillation signal on the device.

5. The method of claim 1, wherein said logic device is a reprogrammable logic device.

6. The method of claim 1, wherein said logic device is an application specific integrated circuit.

7. The method of claim 1, wherein said global signal design element comprises a reset-on-configuration cell.

8. The method of claim 1, wherein said global signal design element comprises a reset-on-configuration cell in combination with an OR gate.

9. The method of claim 1, wherein the design includes a plurality of design sequential elements and the device includes a plurality of device sequential elements, and during said functionally simulating step the global signal network forwards a signal that causes the design sequential elements to behave in a manner that the device sequential elements are expected to behave upon assertion of the global signal network.

10. The method of claim 9, wherein an input port is included in the design.

11. In a Hardware Description Language (HDL) environment for designing a circuit to be implemented in a logic device, the logic device including a global signal network which functions in a manner at least partially independent of the implemented design, a system for simulating and implementing the circuit design in the device, said system comprising:

means for generating a global signal design element including a mechanism for activating the global signal network, said element included in an HDL-based design of the circuit;

means for functionally simulating said design, including said global signal design element; and means for removing said global signal design element from said design after said design is synthesized and before said design is implemented.

12. The system of claim 11, wherein said global signal network is capable of setting the state of a plurality of sequential logic elements on the device.

13. The system of claim 11, wherein said global signal network is capable of electrically isolating a plurality of outputs from the device.

14. The system of claim 11, wherein said global signal network is capable of activating a global oscillation signal on the device.

15. The system of claim 11, wherein said logic device is a reprogrammable logic device.

16. The system of claim 11, wherein said logic device is an application specific integrated circuit.

17. The system of claim 11, wherein said global signal design element comprises a reset-on-configuration cell.

18. The system of claim 11, wherein said global signal design element comprises a reset-on-configuration cell in combination with an OR gate.

19. The system of claim 11, wherein the design includes a plurality of design sequential elements and the device includes a plurality of device sequential elements, and said means for functionally simulating includes means for forwarding a signal from the global signal network that causes the design sequential elements to behave in a manner that the device sequential elements are expected to behave upon assertion of the global signal network.

20. The system of claim 19, wherein an input port is included in the design.

* * * * *